United States Patent
Fukuda

(10) Patent No.: US 9,240,569 B2
(45) Date of Patent: Jan. 19, 2016

(54) DISPLAY AND ELECTRONIC SYSTEM

(75) Inventor: Toshihiro Fukuda, Kanagawa (JP)

(73) Assignee: JOLED INC., Tokyo (JP)

(*) Notice: Subject to any disclaimer, the term of this patent is extended or adjusted under 35 U.S.C. 154(b) by 344 days.

(21) Appl. No.: 13/566,684

(22) Filed: Aug. 3, 2012

(65) Prior Publication Data

US 2013/0038201 A1     Feb. 14, 2013

(30) Foreign Application Priority Data

Aug. 10, 2011  (JP) ................................ 2011-175180

(51) Int. Cl.
*H01L 51/50*  (2006.01)
*H01L 51/52*  (2006.01)
*G02B 5/30*  (2006.01)

(52) U.S. Cl.
CPC .............. *H01L 51/5281* (2013.01); *G02B 5/30* (2013.01); *H01L 51/5218* (2013.01); *H01L 2251/5315* (2013.01)

(58) Field of Classification Search
CPC .. H01L 51/5218; H01L 51/5281; H01L 51/50
USPC ........................................... 313/504; 257/98
See application file for complete search history.

(56) References Cited

U.S. PATENT DOCUMENTS

| 2007/0182885 A1* | 8/2007 | Egi et al. ...................... 349/96 |
| 2010/0007270 A1* | 1/2010 | Suh ............................... 313/504 |
| 2010/0244011 A1* | 9/2010 | Moriya ........................... 257/40 |
| 2010/0320494 A1* | 12/2010 | Kim et al. ....................... 257/98 |
| 2012/0038853 A1* | 2/2012 | Tsai et al. ....................... 349/96 |

FOREIGN PATENT DOCUMENTS

| JP | 2001-357979 | 12/2001 |
| JP | 2010-243769 | 10/2010 |

* cited by examiner

*Primary Examiner* — Karabi Guharay
(74) *Attorney, Agent, or Firm* — Sheridan Ross P.C.

(57) ABSTRACT

A display includes: a light emitting layer; a reflective section reflecting light, that enters through the light emitting layer, to a display surface; an absorption-type polarizing plate provided on the display surface; a retardation film provided between the light emitting layer and the absorption-type polarizing plate; a reflection-type polarizing plate provided between the retardation film and the absorption-type polarizing plate, and reflecting, among light transmitted by the retardation film, light in a predetermined light-axis direction; and an outside-light reflection suppression layer provided between the light emitting layer and the reflection-type polarizing plate, and absorbing part of outside light.

13 Claims, 17 Drawing Sheets

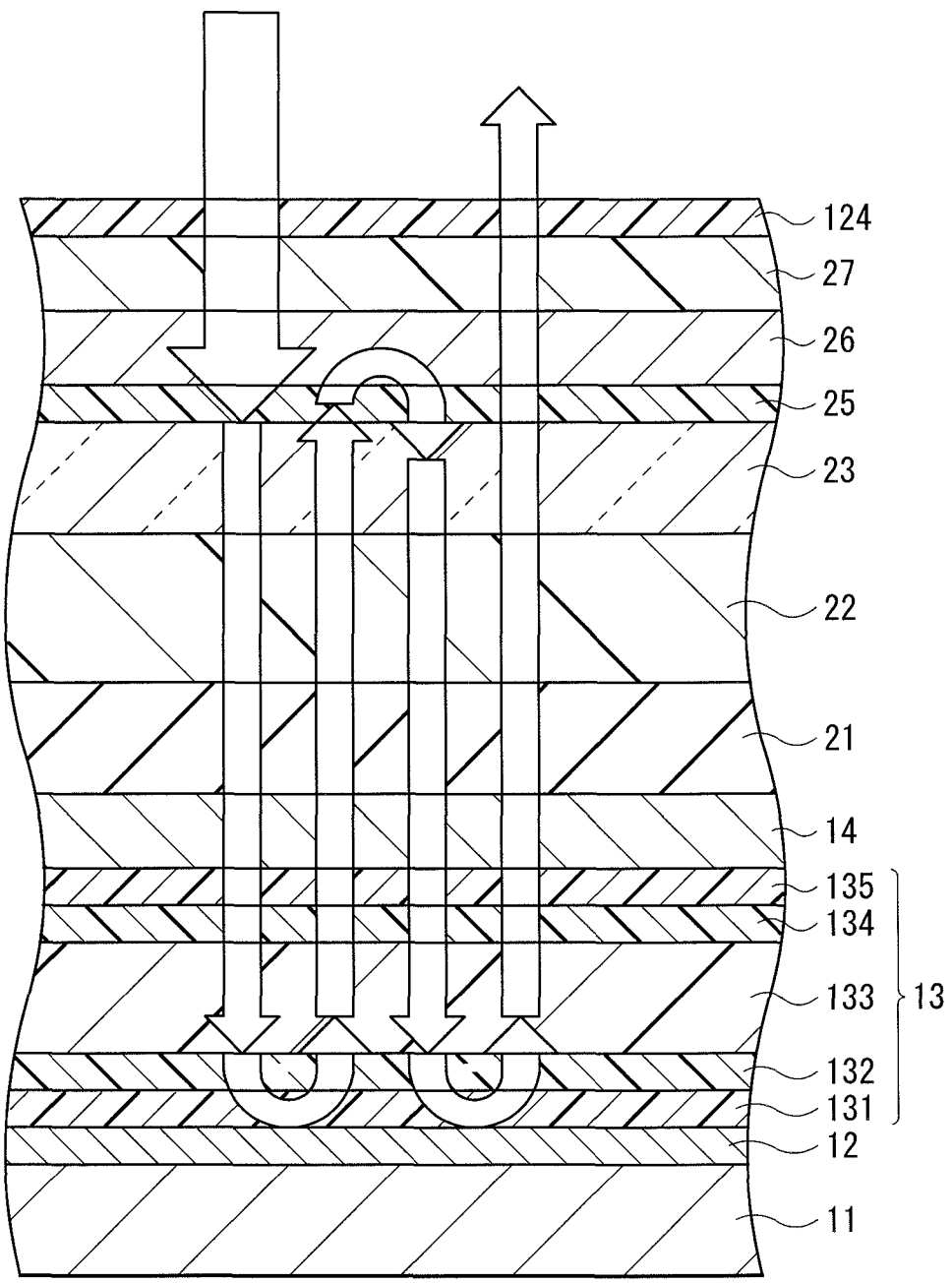
F I G. 11

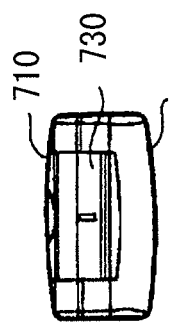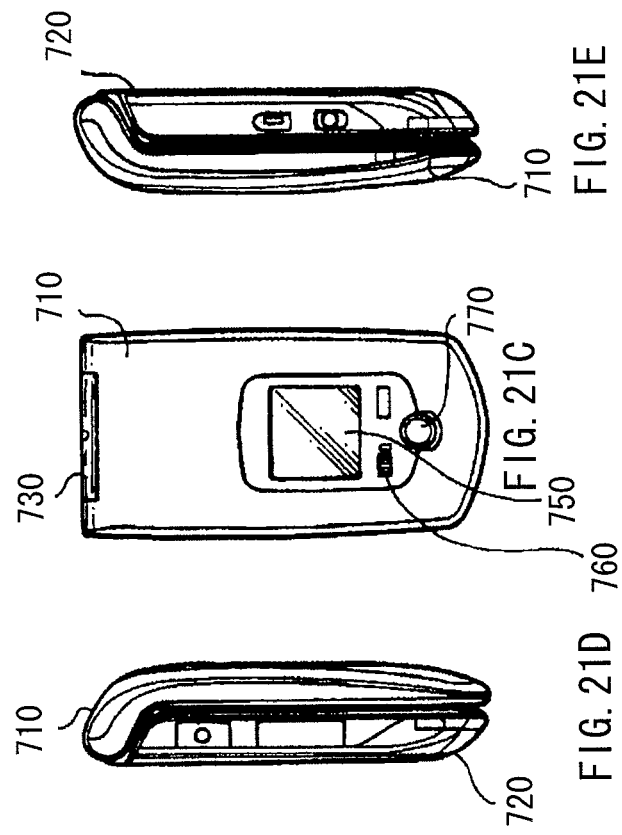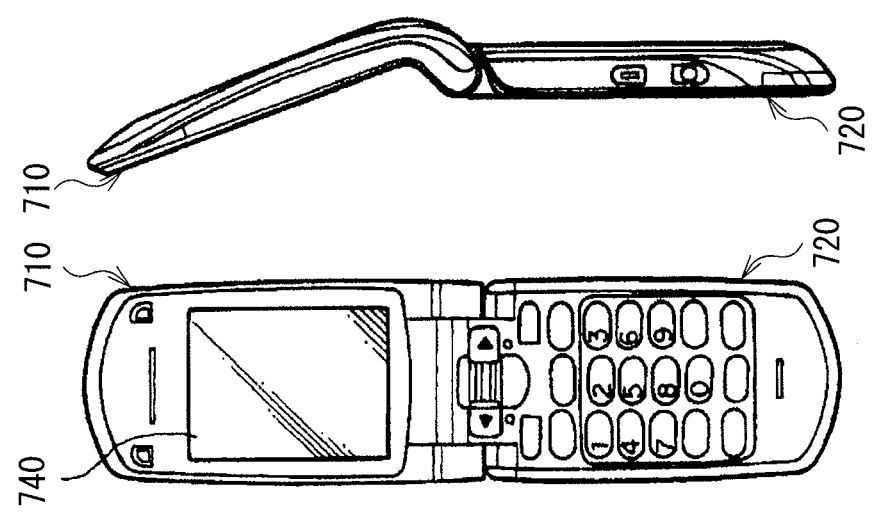

DISPLAY AND ELECTRONIC SYSTEM

CROSS REFERENCES TO RELATED APPLICATIONS

The present application claims priority to Japanese Priority Patent Application JP 2011-175180 filed in the Japan Patent Office on Aug. 10, 2011, the entire content of which is hereby incorporated by reference.

BACKGROUND

The present application relates to a self-luminous display such as an organic electroluminescence (EL) display and an electronic system including the display.

A display device having higher performance has been demanded with development of the information and communication industry. For example, each of an organic electroluminescence (EL) display, an inorganic EL display, and a field emission display (FED) is a display including a self-luminous display device, and has been notified as a next-generation display due to its wide viewing angle, high contrast, and high response speed. For example, the organic EL device includes a lower electrode, a light emitting layer, an upper electrode, and a counter substrate in order of closeness to a drive substrate, and is roughly classified into a bottom emission type where display light is extracted through the drive substrate, and a top emission type where display light is extracted through the counter substrate.

A technique of the self-luminous display, in which a reflective section is provided on a side opposite to a display surface with respect to the light emitting layer, has been proposed in order to efficiently extract light emitted from the light emitting layer. For example, in the case of the top emission type, the lower electrode is configured of a light-reflective metal such as aluminum (Al), silver (Ag), or an alloy of such a metal so as to serve as the reflective section. This enables extraction of reflected light, as display light, of light emitted from the light emitting layer to a direction of the lower electrode, in addition to light directly emitted from the light emitting layer to a direction of the counter electrode.

However, the reflective section also reflects outside light entering through the display surface, which may reduce effective contrast, leading to a reduction in image quality and in visibility. In particular, this greatly affects the image quality and visibility during use of the display in the open. There has been provided a configuration, in which a circularly polarizing plate is provided on a display surface side of the counter substrate, in order to suppress such reflection of outside light. The circularly polarizing plate includes an absorption-type polarizing plate combined with a quarter retardation film. In the display including the circularly polarizing plate, outside light entering through the display surface passes through the absorption-type polarizing plate, and thus changes into linear polarization that then passes through the quarter retardation film. The linear polarization passes through the quarter retardation film and thus changes into circular polarization. The circular polarization is then reflected by the reflective section (lower electrode), and then passes through the quarter retardation film again and thus changes into linear polarization. The linear polarization, which has passed through the quarter retardation film two times, is shifted in phase by $\lambda/2$ with respect to the linear polarization before the first action of passing through the quarter retardation film. Hence, the linear polarization does not go to the display surface but is absorbed by the absorption-type polarizing plate.

According to the above mechanism, the circularly polarizing plate substantially perfectly suppresses reflected light of outside light. However, the circularly polarizing plate greatly attenuates light emitted from the light emitting layer. As a result, light output is reduced, leading to an increase in power consumption and a reduction in life due to an increase in current density. For example, light transmittance of the circularly polarizing plate is about 40%. To address such a difficulty, a technique has been proposed, in which a reflection-type polarizing plate having the same light-axis direction as that of an absorption-type polarizing plate is interposed between the absorption-type polarizing plate and the quarter retardation film in order to improve light output (for example, Japanese Unexamined Patent Application Publication Nos. 2010-243769 and 2001-357979). In this technique, among light emitted from the light emitting layer, light, which has a light-axis direction orthogonal to that of the reflection-type polarizing plate or the absorption-type polarizing plate, is reflected by the reflection-type polarizing plate and the reflective section in this order, and thus passes through the quarter retardation film two times. Consequently, the light is shifted in phase by $\lambda/2$, and extracted through the display surface. As a result, light output increases to twice the square root ($\sqrt{}$) of light transmittance (in a parallel direction) of the absorption-type polarizing plate, or about 90% of light emitted from the light emitting layer.

SUMMARY

However, if the reflection-type polarizing plate is provided between the absorption-type polarizing plate and the quarter retardation film in this way, the reflected light of outside light also passes through the absorption-type polarizing plate and exits through the display surface, which reduces the effect of suppressing reflection of outside light.

It is desirable to provide a display and an electronic system, which prevent a reduction in image quality and in visibility due to reflection of outside light, and suppresses a reduction in extraction efficiency of light from a light emitting layer.

A display according to an embodiment of the present application includes: a light emitting layer; a reflective section reflecting light, that enters through the light emitting layer, to a display surface; an absorption-type polarizing plate provided on the display surface; a retardation film provided between the light emitting layer and the absorption-type polarizing plate; a reflection-type polarizing plate provided between the retardation film and the absorption-type polarizing plate, and reflecting, among light transmitted by the retardation film, light in a predetermined light-axis direction; and an outside-light reflection suppression layer provided between the light emitting layer and the reflection-type polarizing plate, and absorbing part of outside light.

An electronic system according to an embodiment of the present application is provided with a display. The display includes: a light emitting layer; a reflective section reflecting light, that enters through the light emitting layer, to a display surface; an absorption-type polarizing plate provided on the display surface; a retardation film provided between the light emitting layer and the absorption-type polarizing plate; a reflection-type polarizing plate provided between the retardation film and the absorption-type polarizing plate, and reflecting, among light transmitted by the retardation film, light in a predetermined light-axis direction; and an outside-light reflection suppression layer provided between the light emitting layer and the reflection-type polarizing plate, and absorbing part of outside light.

In the display according to the embodiment of the application, outside light entering through the display surface is repeatedly reflected between the reflective section and the reflection-type polarizing plate. During such repeated reflection, the outside light is partially absorbed by the outside-light reflection suppression layer and thus attenuated. On the other hand, among light emitted from the light emitting layer, light extracted through the display surface includes: light that directly passes through the reflection-type polarizing plate and the absorption-type polarizing plate; and light that passes through the retardation film several times while being reflected between the reflection-type polarizing plate and the reflective section, and then is extracted through the display surface.

According to the display and the electronic system of the embodiments of the application, the outside-light reflection suppression layer is provided between the light emitting layer and the reflection-type polarizing plate, making it possible to suppress reflection of outside light. In addition, the reflection-type polarizing plate provided between the retardation film and the absorption-type polarizing plate improves extraction efficiency of light emitted from the light emitting layer. Consequently, a reduction in image quality and in visibility due to reflection of outside light is prevented, and low power consumption and a long life are achieved.

It is to be understood that both the foregoing general description and the following detailed description are exemplary, and are intended to provide further explanation of the application as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the application.

FIG. 11 is a sectional view of a partial display region in which a disposed position of the outside-light reflection suppression layer shown in FIG. 3 is different from that in FIG. 3.

FIGS. 21A and 21B are a front view and a side view of application example 5 in an open state, respectively, and FIGS. 21C to 21G are a front view, a left side view, a right side view, a top view, and a bottom view of the application example 5 in a closed state, respectively.

DETAILED DESCRIPTION

Hereinafter, embodiments of the disclosure will be described in detail with reference to the accompanying drawings. It is to be noted that description is made in the following order.

1. First embodiment (Example where outside-light reflection suppression layer is provided between light emitting layer and retardation film).

2. Modification 1 (Example where outside-light reflection suppression layer is provided in part of retardation film).

3. Modification 2 (Example where outside-light reflection suppression layer is provided in part of color filter layer).

4. Second embodiment (Example where outside-light reflection suppression layer is provided between retardation film and reflection-type polarizing plate).

[First Embodiment]
[Configuration of Display 1]

Figure 1:
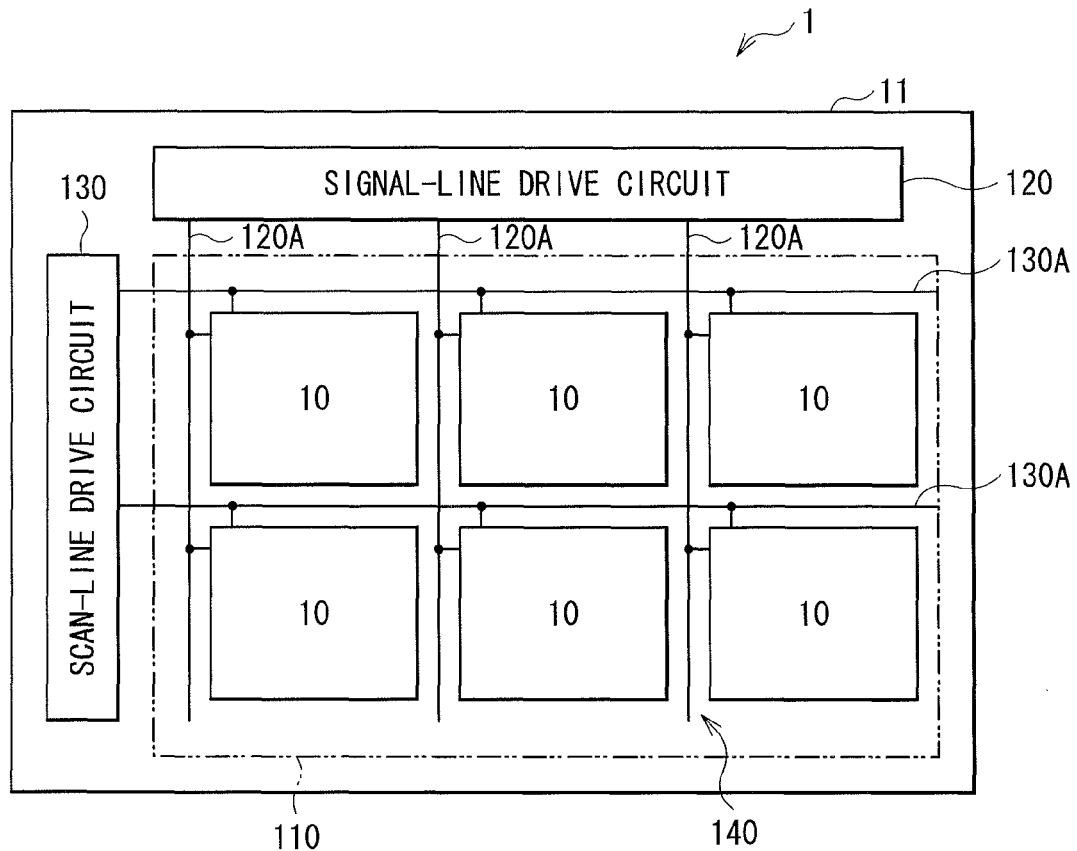
FIG. 1 illustrates a configuration of a display according to a first embodiment of the disclosure.

FIG. 1 illustrates a configuration of a display (display 1) according to a first embodiment of the disclosure. The display 1 is an organic electroluminescence (EL) display, in which, for example, a plurality of organic EL devices 10 emitting light of red, green, and blue are arranged in a matrix on a substrate 11 so as to define a display region 110. A driver-signal-line drive circuit 120 and a scan-line drive circuit 130, each of which is provided for image display, are provided in the periphery of the display region 110.

(Overall Configuration)

Figure 2:
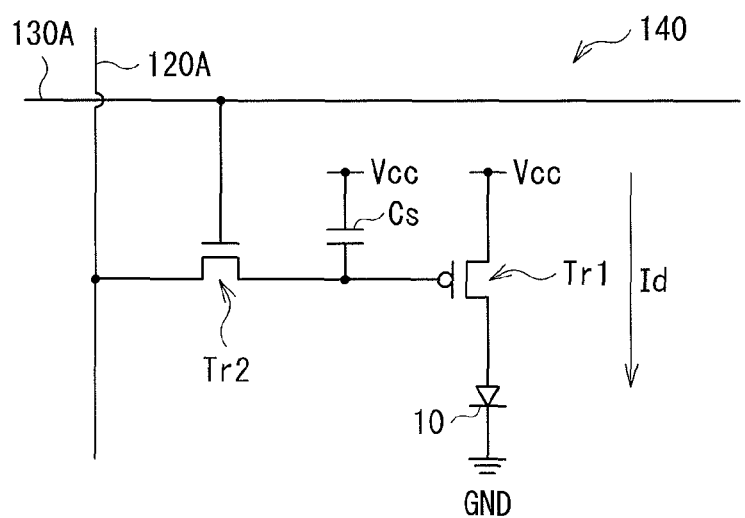
FIG. 2 illustrates an example of a pixel drive circuit shown in FIG. 1.

A plurality of pixel drive circuits 140 are provided in the display region 110. FIG. 2 illustrates an exemplary pixel drive circuit 140. The pixel drive circuit 140 is an active drive circuit provided below a lower electrode 12 described later. Specifically, the pixel drive circuit 140 includes a drive transistor Tr1, a write transistor Tr2, a capacitor (holding capacitance) Cs provided between the transistors Tr1 and Tr2, and the organic EL device 10 connected in series to the drive transistor Tr1 between a first power line (Vcc) and a second power line (GND). Each of the drive transistor Tr1 and the write transistor Tr2 is configured of a thin film transistor (TFT), and may have an inversely-staggered structure (so-called bottom gate type) or a staggered structure (top gate type) without limitation.

In the pixel drive circuit 140, a plurality of signal lines 120A are arranged in a column direction, and a plurality of scan lines 130A are arranged in a row direction. An intersection of each signal line 120A and each scan line 130A corresponds to one organic EL device 10. Each signal line 120A is connected to the signal-line drive circuit 120 that supplies image signals to a source electrode of the write transistor Tr2 through the signal line 120A. Each scan line 130A is connected to the scan-line drive circuit 130 that sequentially supplies scan signals to a gate electrode of each write transistor Tr2 through the scan line 130A.

(Organic EL Device)

Figure 3:
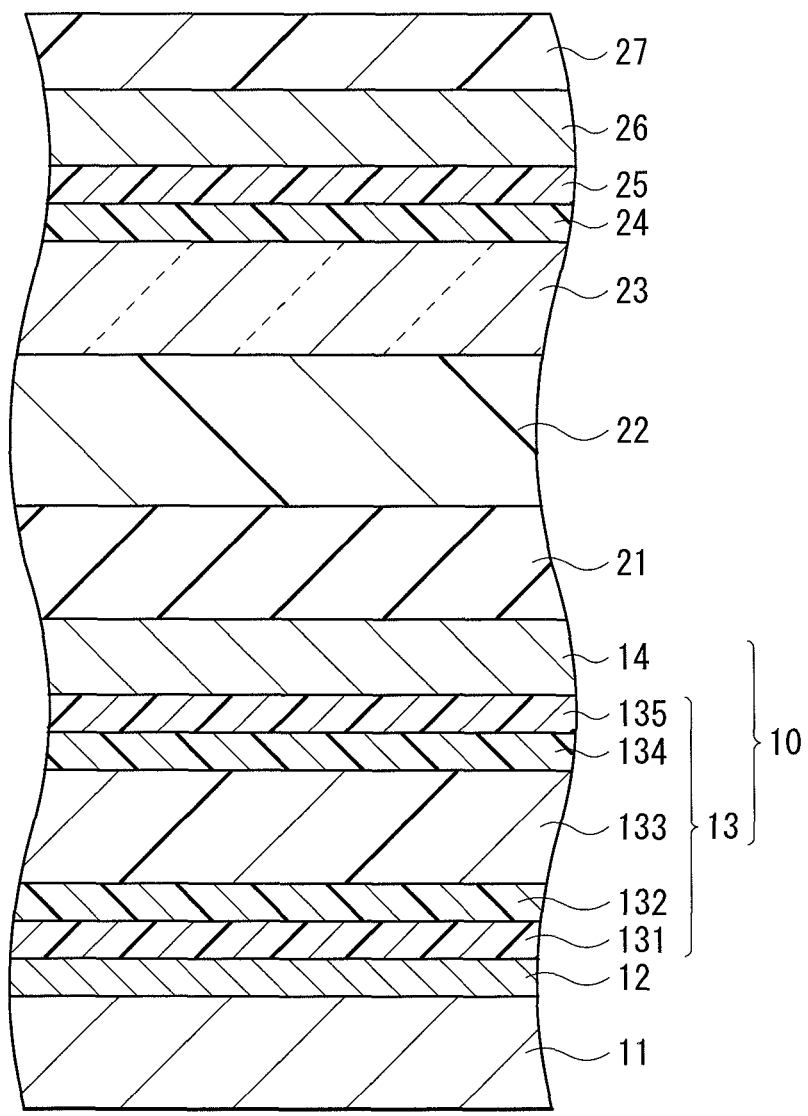
FIG. 3 is a sectional view illustrating a configuration of part of a display region shown in FIG. 1.

FIG. 3 illustrates a sectional configuration of a portion corresponding to one organic EL device 10 in the display region 110 shown in FIG. 1. Each organic EL device 10 has a structure where the drive transistor Tr1 (not shown) of the pixel drive circuit 140, a planarization insulating layer (not shown), a lower electrode 12 (reflective section) as a positive electrode, a bank (bank 15 in FIG. 14 described later), an organic layer 13, and an upper electrode 14 as a negative electrode, those being stacked in this order. The organic layer 13 includes a hole injection layer 131, a hole transport layer 132, a light emitting layer 133, an electron transport layer 134, and an electron injection layer 135 in this order of closeness to the lower electrode 12.

Such an organic EL device 10 is covered with a protective layer 21. Furthermore, a counter substrate 23 including glass or the like is bonded to the entire surface of the protective layer 21 with a sealing section 22 therebetween. On the counter substrate 23, an outside-light reflection suppression layer 24, a quarter retardation film 25 (retardation film), a reflection-type polarizing plate 26, and an absorption-type polarizing plate 27 are provided in this order. The display 1 is of the top emission type, where display light is extracted through the counter substrate 23 (through the absorption-type polarizing plate 27).

The substrate 11 is a support medium having one principal surface on which the organic EL devices are arranged. For example, materials such as quartz, glass, a metal foil, a resin film, or a resin sheet can be used for the substrate 11. In particular, quartz or glass is preferable. In the case of using the resin film or sheet, a material thereof may include: methacrylic resin typified by polymethylmethacrylate (PMMA); polyesters such as polyethylene terephthalate (PET), polyethylene naphthalate (PEN), and polybutylene naphthalate (PBN); and polycarbonate resin. In this case, the substrate preferably has a stacked structure and is preferably subjected to surface treatment in order to reduce water permeability and gas permeability.

The planarization insulating layer, which planarizes the surface of the substrate 11, on which the pixel drive circuits 140 are provided, is preferably configured of a material that is allowed to be accurately patterned. This is because small connection holes (not shown) are to be formed in the planarization insulating layer to connect the drive transistors Tr1 to the lower electrode 12. Examples of a constitutional material of the planarization insulating layer include organic materials such as polyimide and inorganic materials such as silicon oxide ($SiO_2$).

The lower electrode 12 is provided for individual organic EL devices 10 on the planarization insulating layer, and includes a highly light-reflective metal, for example, a single metal element such as chromium (Cr), gold (Au), platinum (Pt), nickel (Ni), copper (Cu), tungsten (W), aluminum (Al), and silver (Ag), or any alloy thereof. Alternatively, the lower electrode 12 may have a stacked structure of the above-described metal film and a transparent conductive film. Examples of the transparent conductive film include indium-tin oxide (ITO), indium zinc oxide (InZnO), and an alloy of zinc oxide (ZnO) and aluminum (Al). In the case where the lower electrode 12 is used as a positive electrode, the lower electrode 12 is preferably configured of a material having a high hole-injection property. However, a material having an inadequate work function value, for example, an aluminum alloy, is also allowed to function as a positive electrode through providing an appropriate hole injection layer 131. In the display 1, light emitted from the light emitting layer 133 to a direction of the substrate 11 is reflected to the display surface by the lower electrode 12.

The bank provides insulation between the lower electrode 12 and the upper electrode 14, and shapes a light emission region into a desired form. The bank has an opening corresponding to the light emission region. For example, the bank is formed by stacking a photosensitive resin such as positive-type photosensitive polybenzoxazole or positive-type photosensitive polyimide on an inorganic insulating material such as $SiO_2$. Although the upper layers of the bank, i.e., the layers from the hole injection layer 131 to the upper electrode 14, may be provided not only on the opening but also on the bank, light emission occurs only in the opening.

The hole injection layer 131, which is provided in common to the plurality of organic EL devices 10, improves hole injection efficiency and functions as a buffer layer preventing current leakage. For example, the hole injection layer 131 preferably has a thickness of 5 nm to 100 nm both inclusive, and more preferably 8 nm to 50 nm both inclusive.

Examples of a constitutional material of the hole injection layer 131 include: conductive polymers such as polyaniline and its derivatives, polythiophene and its derivatives, polypyrrole and its derivatives, polyphenylene and its derivatives, polythienylenevinylene and its derivatives, polyquinoline and its derivatives, poly-quinoxaline and its derivatives, and a polymer including an aromatic amine structure in its principal or side chain; metal phthalocyanine (copper phthalocyanine); and carbon. The constitutional material should be appropriately selected depending on materials of an electrode or an adjacent layer.

In the case where the hole injection layer 131 includes a polymer material, the weight-average molecular weight (Mw) of the material is, for example, about 2000 to 300000, and preferably about 5000 to 200000. The Mw of less than 5000 may lead to dissolution of each layer subsequent to the hole transport layer 132 during formation of the layer. The Mw of more than 300000 may cause gelation of the material, causing film formation to be difficult.

Examples of a typical polymer material used for the hole injection layer 131 include: polyaniline and/or oligoaniline; and polydioxythiophene such as poly(3,4-ethylenedioxy thiophene) (PEDOT). In detail, for example, Nafion (registered trademark) and Liquion (trademark) available from H. C. Starck, "ELsource" (trademark) available from Nissan Chemical Industries, Ltd, and a conductive polymer "Verazol" (trademark) available from Soken Chemical & Engineering Co., Ltd may be used.

The hole transport layer 132, which improves hole transport efficiency into the light emitting layer 133, is provided on the hole injection layer 131 in common to the plurality of organic EL devices 10.

Preferable thickness of the hole transport layer 132, which varies depending on an overall configuration of the device, is, for example, 10 nm to 200 nm both inclusive, and more preferably the thickness is 15 nm to 150 nm both inclusive. As a polymer material configuring the hole transport layer 132, a luminescent material dissoluble in organic solvent is allowed to be used, including, for example, polyvinyl carbazole and its derivatives, polyfluorene and its derivatives, polyaniline and its derivatives, polysilane and its derivatives, a polysiloxane derivative including an aromatic amine in its side or principal chain, polythiophene and its derivatives, and polypyrrole.

The weight-average molecular weight (Mw) of the polymer material is, for example, about 50000 to 300000, preferably, about 100000 to 200000. The Mw of less than 50000 causes escape of a low-molecular component in the polymer material, leading to formation of dots in the hole injection layer and/or the hole transport layer. This may in turn cause a reduction in initial performance of the organic EL device 10, or degradation of the device. On the other hand, the Mw of more than 300000 may cause gelation of the material, causing film formation to be difficult.

The weight-average molecular weight (Mw) is a value obtained as the weight-average molecular weight in polystyrene through gel permeation chromatography (GPC) with tetrahydrofuran as a solvent.

In the light emitting layer 133, electrons recombine with holes in response to an applied electric field, resulting in light emission. For example, each organic EL device 10 emitting red light has a red light-emitting layer, and each organic EL device 10 emitting green light has a green light-emitting layer. The organic EL devices 10 each emitting blue light have a blue light-emitting layer common to the organic EL devices 10. Preferable thickness of each of the red light-emitting layer and the green light-emitting layer, which varies depending on an overall configuration of the device, is, for example, 10 nm to 200 nm both inclusive. More preferably, the thickness is 15 nm to 150 nm both inclusive. Examples of a polymer material configuring each of the red light-emitting layer and the green light-emitting layer include a polyfluorene-series polymer derivative, a (poly) paraphenylene vinylene derivative, a polyphenylene derivative, a polyvinyl carbazole derivative, a polythiophene derivative, a perylene-based dye, a coumarin-based dye, and a rhodamine-based dye. The above polymers may be each doped with an organic EL material to be used. In detail, for example, the polymer may be doped with rubrene, perylene, 9,10-diphenyl anthracene, tetraphenyl butadiene, Nile red, or coumarin 6 to be used. The configuration of the light emitting layer is not limited to the above. For example, the red light-emitting layer, the green light-emitting layer, and the blue light-emitting layer may be disposed together for individual organic EL devices 10.

The blue light-emitting layer includes, for example, an anthracene compound as a host material doped with an organic luminescent material, as a guest material, such as a blue or green low-molecular fluorescent dye, a phosphorescent dye, or a metal complex.

The electron transport layer 134, which improves electron transport efficiency into the light emitting layer 133, is provided as a common layer for the plurality of organic EL devices 10. Examples of a material for the electron transport layer 134 include: quinoline, perylene, phenanthroline, phenanthrene, pyrene, bisstyryl, pyrazine, triazole, oxazole, fullerene, oxadiazole, fluorenone, anthracene, naphthalene, butadiene, coumarin, acridine, and stilbene; any derivative thereof; and metal complexes thereof such as tris(8-quinolinyloxy) aluminum (aften abbreviated as $Alq_3$).

The electron injection layer 135 improves electron injection efficiency, and is provided as a common layer over the entire surface of the electron transport layer 134. Examples of a material for the electron injection layer 135 include lithia ($Li_2O$) being an oxide of lithium (Li), cesium carbonate ($Cs_2CO_3$) being a complex oxide of cesium, and a mixture of them. In addition, the material includes simple substances of metals having a small work function such as alkaline earth metals such as calcium (Ca) and barium (Ba), alkali metals such as lithium and cesium, indium (In), and magnesium, and any alloy thereof. Furthermore, the material includes simple substances of oxides, composite oxides, and fluorides of the metals, and mixtures of them.

The upper electrode 14 is provided over the entire surface of the electron injection layer 135 in isolation from the lower electrode 12. In other words, the upper electrode 14 is a common electrode for the plurality of organic EL devices 10. The upper electrode 14 is formed of, for example, a metal conductive film having a thickness of 3 nm to 8 nm both inclusive. In detail, the upper electrode 14 is formed of, for example, an alloy including aluminum (Al), magnesium, calcium, or sodium (Na). In particular, an alloy of magnesium and silver (Mg—Ag alloy) is preferable because of its high light-transmittance and high conductivity. The ratio of magnesium to silver is preferably, but not limited to, within a range of Mg/Ag=20/1 to 1/1 in thickness ratio. In addition, an alloy of aluminum and lithium (Al—Li alloy) may be used for the upper electrode 14.

The upper electrode 14 may be formed of a mixed layer containing an organic luminescent material such as an aluminum quinoline complex, a styryl amine derivative, or a phthalocyanine derivative. In this case, a light-transmissive layer such as an Mg—Ag alloy layer may be additionally provided as a third layer.

(Protective Layer, Sealing Section, and Counter Substrate)

The protective layer 21 may be configured of either of an insulating material or a conductive material, and has a thickness of, for example, 2 μm to 3 μm both inclusive. For example, inorganic amorphous insulating materials such as amorphous silicon (α-silicon), amorphous silicon carbide (α-SiC), amorphous silicon nitride ($\alpha\text{-}Si_{1-x}N_x$), and amorphous carbon (α-C) are used for the protective layer 21. Such materials do not form grains and thus have low water permeability, leading to an excellent protective film. The sealing section 22 is configured of a thermosetting resin, a UV curing resin, or the like.

The counter substrate 23 is located on an upper electrode 14 side of the organic EL device 10, and seals the organic EL device 10 in conjunction with the sealing section 22. The counter substrate 23 is configured of glass, for example.

Figure 14:
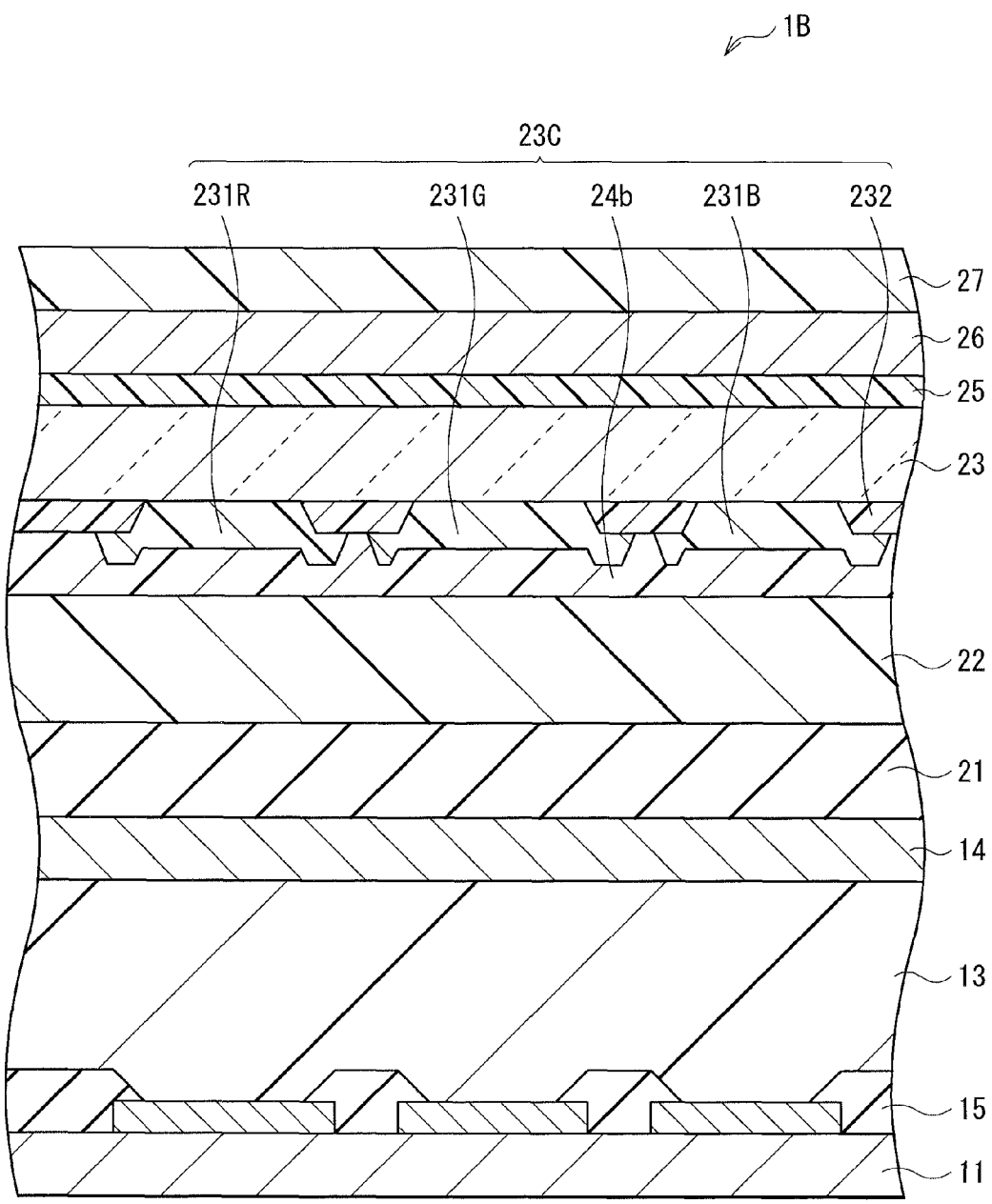
FIG. 14 is a sectional view illustrating a configuration of a display according to Modification 2.

An exemplary counter substrate 23 has a color filter layer (color filter layer 23C in FIG. 14) thereon, including color filters (color filters 231R, 231G, and 231B in FIG. 14) and a black matrix (black matrix 232 in FIG. 14).

As the color filters, red filters (color filters 231R), green filters (color filters 231G), and blue filters (color filters 231B) are arranged in order in correspondence to the organic EL devices 10 emitting red light, the organic EL devices 10 emitting green light, and the organic EL devices 10 emitting blue light, respectively. The red filters, the green filters, and the blue filters, each filter having a rectangular shape, may be arranged without gaps. The color filters are each configured of resin containing pigment. The pigment is appropriately selected, so that each color filter is allowed to be adjusted such that light-transmittance is high in an objective wavelength range of red, green, or blue, but is low in other wavelength ranges.

An exemplary black matrix is configured of a black resin film including a black colorant to have an optical density of one or more, or configured of a thin film filter utilizing thin-film interference. The black resin film is preferable since the black resin film is allowed to be inexpensively and readily prepared. An exemplary thin-film filter includes one or more of thin films including metal, metal nitride, or metal oxide, and attenuates light using thin-film interference. In detail, the exemplary thin-film filter includes chromium and chromium trioxide ($Cr_2O_3$) being stacked alternately.

The surfaces (surfaces facing the sealing section 22) of the color filters are covered with an overcoat layer. The overcoat layer includes a coating agent that improves flatness of the surface of each color filter while protecting the surface, and is configured of an organic material such as resin, or an inorganic material such as SiO, SiN, and ITO.

(Outside-Light Reflection Suppression Layer)

The outside-light reflection suppression layer 24 absorbs part of outside light entering through the display surface (through the absorption-type polarizing plate 27) and part of outside light that is reflected by the lower electrode 12 and enters from a direction of the substrate 11. The outside-light reflection suppression layer 24 suppresses going of the outside light reflected by the lower electrode 12 to the display surface. The outside-light reflection suppression layer 24 absorbs and attenuates not only the outside light reflected by the lower electrode 12 but also outside light reflected by surrounding wirings, for example. In the present embodiment, the outside-light reflection suppression layer 24 is provided between the light emitting layer 133 and the quarter retardation film 25. In detail, the outside-light reflection suppression layer 24 is provided between the counter substrate 23 and the quarter retardation film 25 while being in contact with them. The outside-light reflection suppression layer 24 has a transmittance of outside light (wavelength of 380 nm to 780 nm both inclusive, particularly, 430 nm to 680 nm both inclusive) of, for example, 95% to 71% both inclusive, excluding surface-reflected light. The transmittance is preferably more than 75%. This is because transmittance of more than 75% allows an increase in luminance by 10% or more while reflection of outside light is suppressed.

The outside-light reflection suppression layer 24 is configured of, for example, resin mixed with a predetermined concentration of dye or pigment, and has a thickness of, for example, 30 nm to 500 nm both inclusive. For example, polyethylene terephthalate (PET), triacetylcellulose (TAC), polyvinyl alcohol (PVA), or acryl is used as the resin material, and, for example, azo dye or a pigment is mixed therein.

(Quarter Retardation Film)

The quarter retardation film 25 is provided between the light emitting layer 133 and the absorption-type polarizing plate 27, and set in combination with the absorption-type polarizing plate 27 to function as a circularly polarizing plate. The outside light enters the absorption-type polarizing plate 27 through the display surface and changes into linear polarization through the absorption-type polarizing plate 27. The linear polarization then passes through the quarter retardation film 25 and thus changes into circular polarization. In an exemplary quarter retardation film 25, both sides of a wave plate (wave plate 251 in FIG. 13) are protected by triacetylcellulose (TAC) layers (TAC layer 252 in FIG. 13).

(Reflection-Type Polarizing Plate)

The reflection-type polarizing plate 26 is provided between the quarter retardation film 25 and the absorption-type polarizing plate 27, and reflects light having a light axis in a predetermined direction, and transmits light in a direction orthogonal to that predetermined direction. Light emitted from the light emitting layer 133 is reflected between the reflection-type polarizing plate 26 and the lower electrode 12, so that the light passes through the quarter retardation film 25 two times and then is transmitted to a direction of the display surface. Consequently, light extraction efficiency is improved. An exemplary reflection-type polarizing plate 26 includes metal wires of aluminum, silver, chromium, or the like that are arranged in parallel on the surface of a glass substrate at a constant period in correspondence to the lower electrode 12.

(Absorption-Type Polarizing Plate)

The absorption-type polarizing plate 27 is provided on the display surface, and absorbs light having a light axis in a predetermined direction among the incident outside light, and transmits light in a direction orthogonal to that predetermined direction. The polarizing axis of the absorption-type polarizing plate 27 is parallel to that of the reflection-type polarizing plate 26. An exemplary absorption-type polarizing plate 27 includes a stretched hydrophilic polymer film such as a polyvinyl alcohol (PVA)-based film to which iodine or a dichroic dye is absorbed.

[Method of Manufacturing Display 1]

A method of manufacturing the display 1 according to one embodiment is now described.

(Formation Step of Lower Electrode 12)

First, the pixel drive circuit 140 including the drive transistor Tr1 is formed on the substrate 11 including the above-described material, and then a planarization insulating layer including, for example, a photosensitive resin is formed thereon. A metal conductive film including, for example, Al, Ag, or an alloy containing one of Al and Ag is formed on the entire surface of the substrate 11, and then the conductive film is patterned into the lower electrode 12. Here, the lower electrode 12 is formed so as to be electrically connected to the drain electrode of the drive transistor Tr1 through a contact hole (not shown) of the planarization insulating layer.

(Formation Step of Bank)

Then, an inorganic insulating material such as $SiO_2$ is deposited on the lower electrode 12 and the planarization insulating layer by, for example, chemical vapor deposition (CVD), and then patterned. A photosensitive resin is then stacked thereon to form a bank.

After formation of the bank, the surface of the substrate 11, on which the lower electrode 12 and the bank is formed, is subjected to oxygen plasma treatment, so that contaminants such as organic substances adhering on the surface are removed to improve wettability. In detail, the substrate 11 is heated to a predetermined temperature, for example, about 70° C. to 80° C., and then subjected to plasma treatment ($O_2$ plasma treatment) with oxygen as a reactive gas under atmospheric pressure.

(Step of Water Repellent Treatment)

The substrate 11 is then subjected to plasma treatment ($CF_4$ plasma treatment) with tetrafluoromethane as a reactive gas under atmospheric pressure, and then the substrate 11, which has been heated by the plasma treatment, is cooled to room temperature. The top surface and the side surfaces of the bank particularly have high water repellency through this treatment. Thus, wettability of each surface is reduced.

(Formation Steps of Hole Injection Layer 131 and Hole Transport Layer 132)

After the water repellent treatment, the hole injection layer 131 and the hole transport layer 132, each layer including the above-described material, are formed in common to the plurality of organic EL devices 10. For example, the hole injection layer 131 and the hole transport layer 132, each layer including the above-described material, are deposited in this order on the lower electrode 12 and the bank by an evaporation process.

(Formation Step of Light Emitting Layer 133)

After formation of the hole transport layer 132, the light emitting layer 133 is formed on the hole transport layer 132. In an exemplary formation step of the light emitting layer 133, the red light-emitting layer and the green light-emitting layer are formed on the hole transport layer 132 of each organic EL device 10 emitting red light and the hole transport layer 132 each organic EL device 10 emitting green light, respectively, and then the blue light-emitting layer including the above-described material is formed as a common layer over the entire surface of the hole transport layer 132 of each organic EL device 10 emitting blue light by, for example, an evaporation process.

(Formation Steps of Electron Transport Layer 134, Electron Injection Layer 135, and Upper Electrode 14)

The electron transport layer 134, the electron injection layer 135, and the upper electrode 14, each of which includes the above-described material, are formed after formation of the light emitting layer 133 by, for example, an evaporation process.

After formation of the upper electrode 14, the protective layer 21 is formed by, for example, an evaporation process or a CVD process. During this formation step, preferably, the deposition temperature is set at room temperature in order to prevent a reduction in luminance due to degradation of the light emitting layer 133. In addition thereto, the protective layer 21 is preferably deposited at a condition where film stress is minimized in order to prevent separation of the protective layer 21.

The electron transport layer 134, the electron injection layer 135, the upper electrode 14, and the protective layer 21 may be formed across the entire area without any mask. That is, these layers are formed as so-called solid films. In addition, the electron transport layer 134, the electron injection layer 135, the upper electrode 14, and the protective layer 21 are preferably continuously formed within one deposition apparatus without exposure to the atmosphere. This is because degradation of the device due to water in the atmosphere is prevented thereby.

If an auxiliary electrode (not shown) is formed in the same step as that of the lower electrode 12, portions of the layers from the hole injection layer 131 to the electron injection layer 135 formed on the auxiliary electrode may be removed by, for example, laser aberration before formation of the upper electrode 14. This allows direct connection of the upper electrode 14 to the auxiliary electrode, leading to more reliable electrical contact.

After formation of the protective layer 21, the counter substrate 23 is bonded onto the protective layer 21 with the sealing section 22 therebetween. It is to be noted that the color filter layer including the above-described material is beforehand formed on the counter substrate 23.

(Formation Step of Outside-Light Reflection Suppression Layer 24)

After bonding the counter substrate 23, for example, a resin layer including acrylic resin mixed with a predetermined concentration of azo dye is applied on the counter substrate 23 and then cured, so that the outside-light reflection suppression layer 24 is formed.

(Formation Steps of Quarter Retardation Film 25, Reflection-Type Polarizing Plate 26, and Absorption-Type Polarizing Plate 27)

The quarter retardation film 25, the reflection-type polarizing plate 26, and the absorption-type polarizing plate 27 are formed, after forming the outside-light reflection suppression layer 24, in this order on the outside-light reflection suppression layer 24. The outside-light reflection suppression layer 24, the quarter retardation film 25, the reflection-type polarizing plate 26, and the absorption-type polarizing plate 27 may be beforehand formed on one surface of the counter substrate 23 that is then bonded to the protective layer 21. The display 1 shown in FIGS. 1 to 3 is completed through the above steps.

[Function and Effect of Display 1]

In the display 1, scan signals are supplied to each pixel from the scan-line drive circuit 130 through the gate electrode of the write transistor Tr2, and image signals from the signal-line drive circuit 120 are held by the holding capacitance Cs through the write transistor Tr2. Specifically, the drive transistor Tr1 is controlled to be ON or OFF in response to the signal held in the holding capacitance Cs, so that a drive current Id is injected into the organic EL device 10, leading to recombination of holes with electrons for light emission. Such emitted light is extracted through the display surface through the upper electrode 14, the color filter, the counter substrate 23, the outside-light reflection suppression layer 24, the quarter retardation film 25, the reflection-type polarizing plate 26, and the absorption-type polarizing plate 27.

During this operation, while the organic EL device 10 emitting red light has both the red light-emitting layer and the blue light-emitting layer, energy transfer occurs to a red emission site having the lowest energy level in the organic EL device 10, and consequently red emission (wavelength of 620 nm to 750 nm both inclusive) is dominant. While the organic EL device 10 emitting green light has both the green light-emitting layer and the blue light-emitting layer, energy transfer occurs to a green emission site having a lower energy level in the organic EL device 10, and consequently green emission (wavelength of 495 nm to 570 nm both inclusive) is dominant. Since the organic EL device 10 emitting blue light has only the blue light-emitting layer, blue light emission (wavelength of 450 nm to 495 nm both inclusive) occurs in the organic EL device 10. Here, the outside-light reflection suppression layer 24 is provided between the light emitting layer 133 and the reflection-type polarizing plate 26, thus allowing suppression of going of light, which is resulted from reflection of outside light by the lower electrode 12, to the display surface. In addition, the reflection-type polarizing plate 26 is provided between the quarter retardation film 25 and the absorption-type polarizing plate 27, thus allowing improvement in extraction efficiency of light emitted from the light emitting layer 133. These are described below.

Figure 4A:
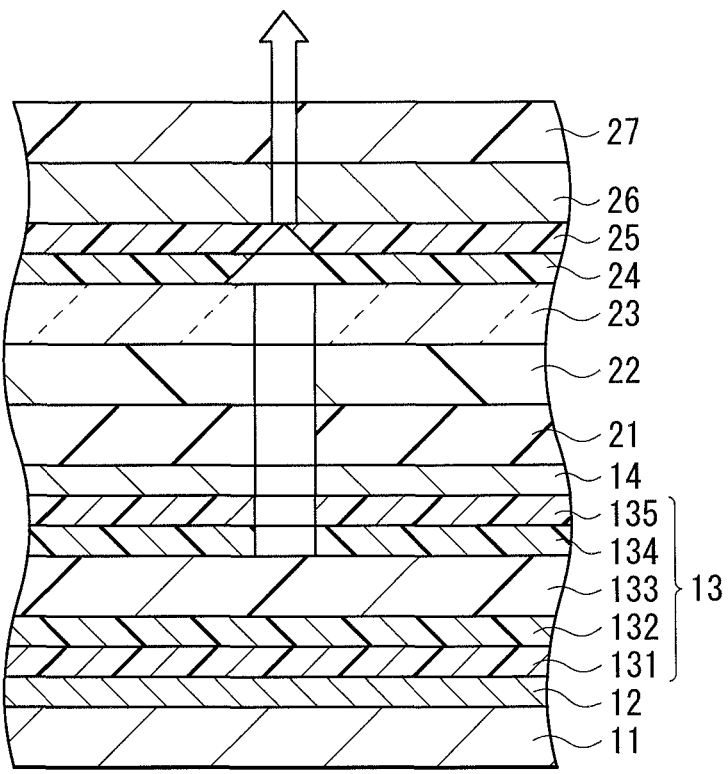
FIGS. 4A and 4B are sectional views for explaining extraction of light emitted from a light emitting layer shown in FIG. 3 through a display surface.
Figure 4B:
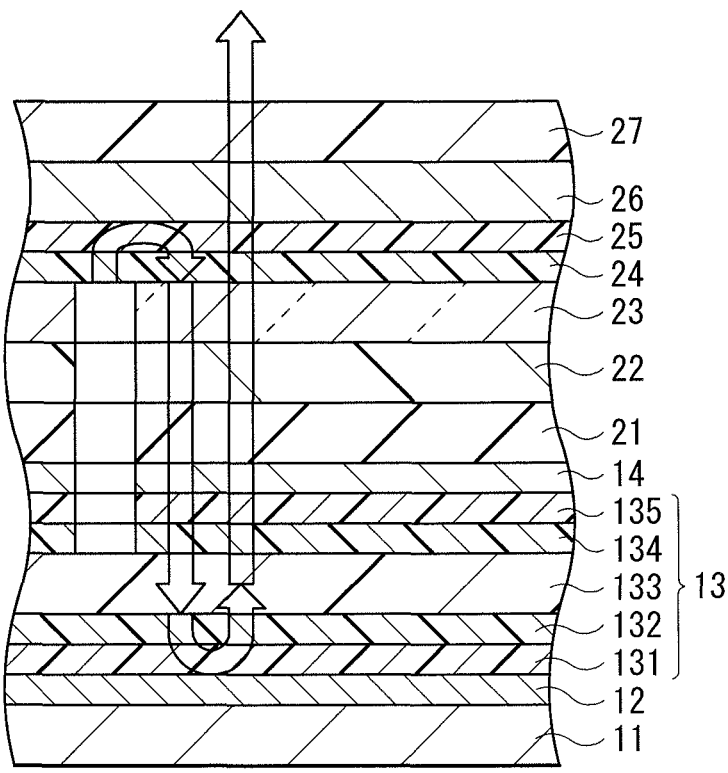
Figure 5:
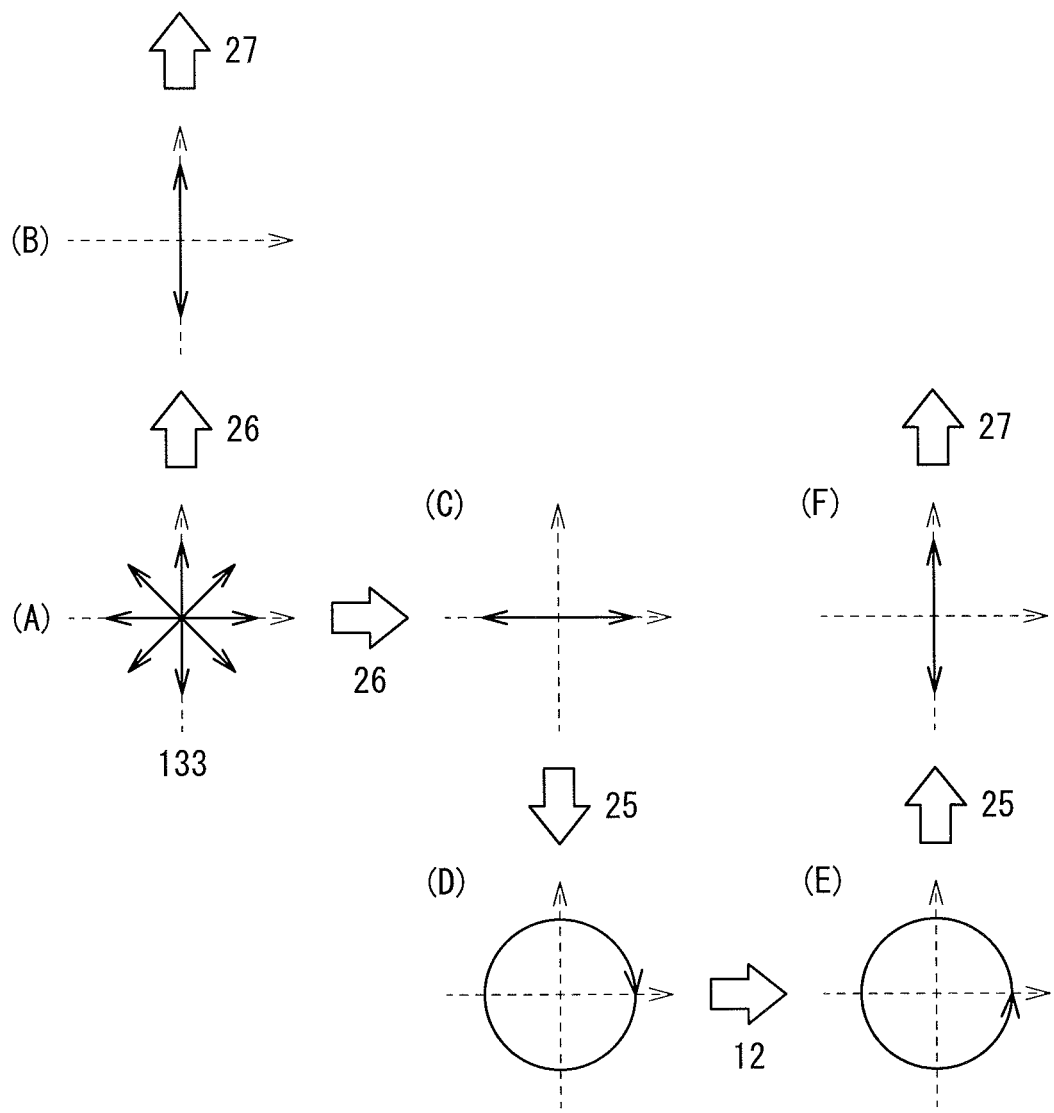
FIG. 5 is a schematic view for explaining a polarization direction of emitted light shown in FIGS. 4A and 4B.

The extraction paths of light emitted from the light emitting layer 133 through the display surface are roughly classified into two as shown in FIGS. 4A and 4B. (A) to (F) of FIG. 5 each schematically illustrate a polarization direction of light along such a light extraction path. The light emitting layer 133 emits non-polarized light as shown in (A) of FIG. 5. Among such non-polarized light, light in a light axis direction as shown in (B) of FIG. 5 is directly transmitted by the reflection-type polarizing plate 26 and the absorption-type polarizing plate 27 (FIG. 4A). On the other hand, light in a light axis direction ((C) of FIG. 5) orthogonal to that in (B) of FIG. 5 is reflected by the reflection-type polarizing plate 26. The reflected light changes into circular polarization as shown in (D) of FIG. 5 after passing through the quarter retardation film 25. The light is reflected by the lower electrode 12, so that its circular polarization direction is reversed ((E) of FIG. 5). The light then passes through the quarter retardation film 25 again, and thus changes into linear polarization inclined by 90° ((F) of FIG. 5) from a direction before being reflected by the reflection-type polarizing plate 26 ((C) of FIG. 5). The linear polarization is then transmitted by the reflection-type polarizing plate 26 and the absorption-type polarizing plate 27 (FIG. 4B).

Consequently, along the light path as shown in FIG. 4A, light advances through the outside-light reflection suppression layer 24, the quarter retardation film 25, the reflection-type polarizing plate 26, and the absorption-type polarizing plate 27 in this order. Along the light path as shown in FIG. 4B, light advances through the outside-light reflection suppression layer 24 and the quarter retardation film 25 in this order, and then is reflected by the reflection-type polarizing plate 26, and then advances through the quarter retardation film 25 and the outside-light reflection suppression layer 24 in this order, and then is reflected by the lower electrode 12, and then advances through the outside-light reflection suppression layer 24, the quarter retardation film 25, the reflection-type polarizing plate 26, and the absorption-type polarizing plate 27 in this order. Specifically, intensity $I_1$ of extracted light shown in FIG. 4A and intensity $I_2$ of extracted light shown in FIG. 4B are expressed by numerical expression (1) and numerical expression (2), respectively, where intensity of light emitted from the light emitting layer 133 is $I_0$, light transmittance of the outside-light reflection suppression layer 24 is Ta, reflectance of the reflection-type polarizing plate 26 to natural light is r, reflectance of the lower electrode 12 is R, and light transmittance in a direction parallel to the polarization axis of the absorption-type polarizing plate 27 is Tp. The subsequent numerical expressions are shown with similar representations.

[Numerical Expression 1]

$$I_1 = I_0 \times (1-r) \times T_p \times T_a \quad (1)$$

[Numerical Expression 2]

$$I_2 = I_0 \times r \times T_p \times (T_a)^3 \times R \quad (2)$$

Intensity I of display light extracted through the display surface corresponds to the sum of $I_1$ and $I_2$, which is expressed by numerical expression (3).

[Numerical Expression 3]

$$I = I_1 + I_2 = I_0 \times T_p \times T_a \times [1 + r\{(T_a)^2 \times R - 1\}] \quad (3)$$

Figure 6:
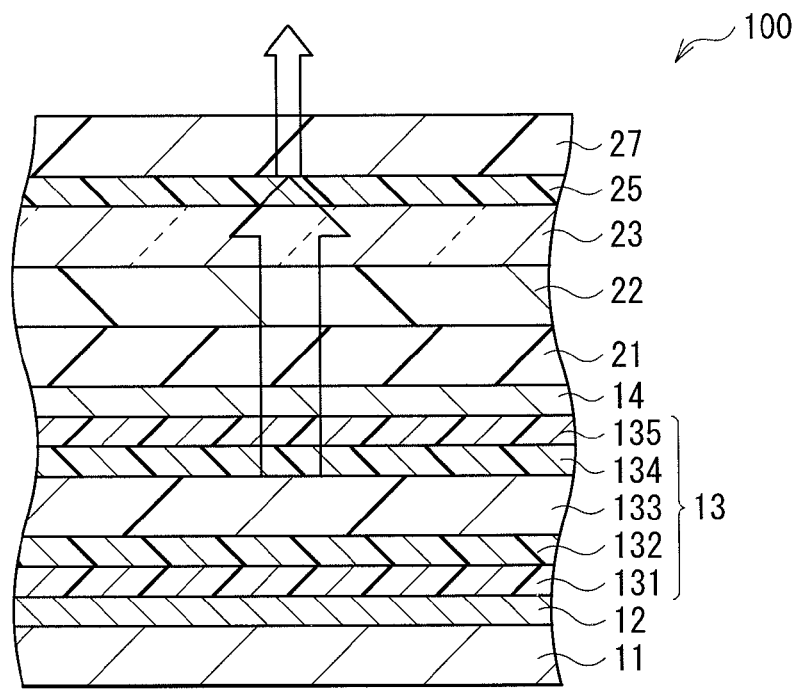
FIG. 6 is a sectional view illustrating a partial configuration of a display according to comparative example 1.

In contrast, FIG. 6 illustrates a light extraction path in a display (display 100) according to comparative example 1. The display 100 does not have the outside-light reflection suppression layer 24 and the reflection-type polarizing plate 26. Consequently, in the display 100, among light emitted from the light emitting layer 133, only the light in the same direction as that of the polarization axis of each of the reflection-type polarizing plate 26 and the absorption-type polarizing plate 27 is extracted through the display surface.

A ratio of intensity I of display light of the display 1 to intensity I' of display light of the display 100 is defined as extraction improvement rate a of display light, which is expressed by numerical expression (4). The numerical expression (4) is based on the assumption that r is 0.5, R is 0.9, Tp is 0.86, and the quarter retardation film 25 and the absorption-type polarizing plate 27 in the display 100 each singly have a light transmittance of 0.43.

[Numerical Expression 4]

$$\alpha = \frac{I}{I'} \quad (4)$$

$$= \frac{I_0 \times 0.86 \times T_a \times [1 + 0.5\{(T_a)^2 \times 0.9 - 1\}]}{I_0 \times 0.43}$$

$$= T_a\{1 + 0.9 \times (T_a)^2\}$$

Figure 7:
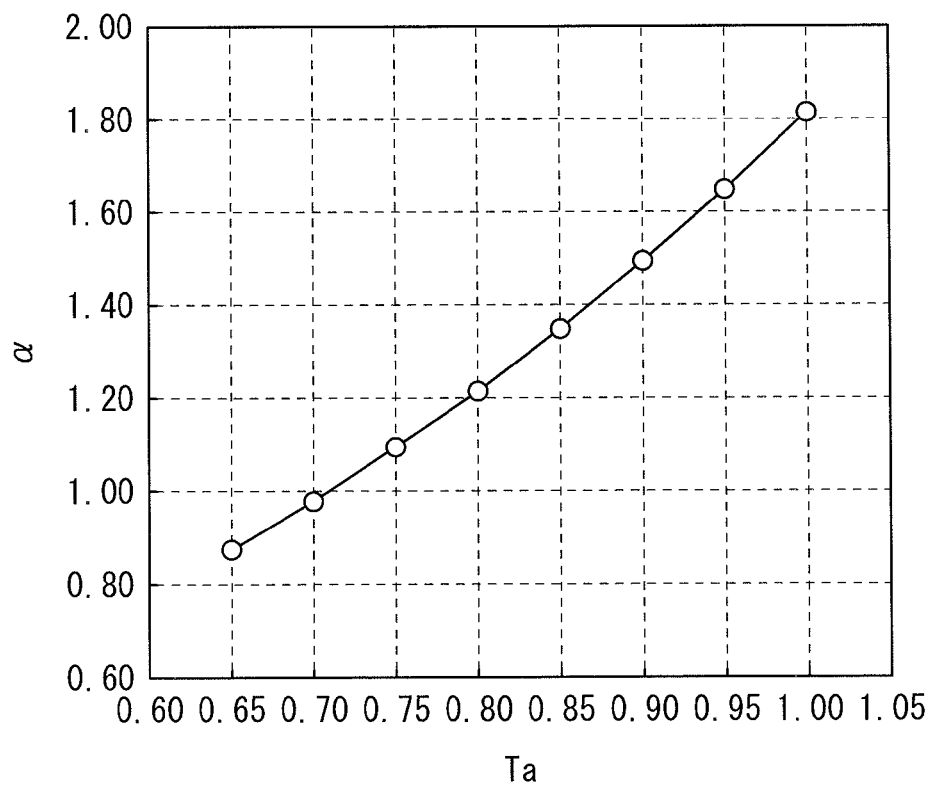
FIG. 7 is a graph illustrating a relationship between light transmittance of an outside-light reflection suppression layer shown in FIG. 3 and light extraction efficiency.

FIG. 7 illustrates a relationship between the light transmittance Ta of the outside-light reflection suppression layer 24 and the improvement rate α. The rate α of more than 1 represents that intensity of extracted light from the display 1 of the present embodiment is larger than that from the display 100, namely, represents improvement in light extraction efficiency. Under the above condition, if the light transmittance Ta of the outside-light reflection suppression layer 24 is larger than 0.71 (71%), the light extraction efficiency is improved. If the light transmittance Ta is larger than 0.75, the light extraction efficiency is improved by 10% or more. While there is no upper limit value for Ta in the view of the light extraction efficiency, Ta is preferably 0.95 or less for the original effect of suppressing reflection of outside light.

Figure 8:
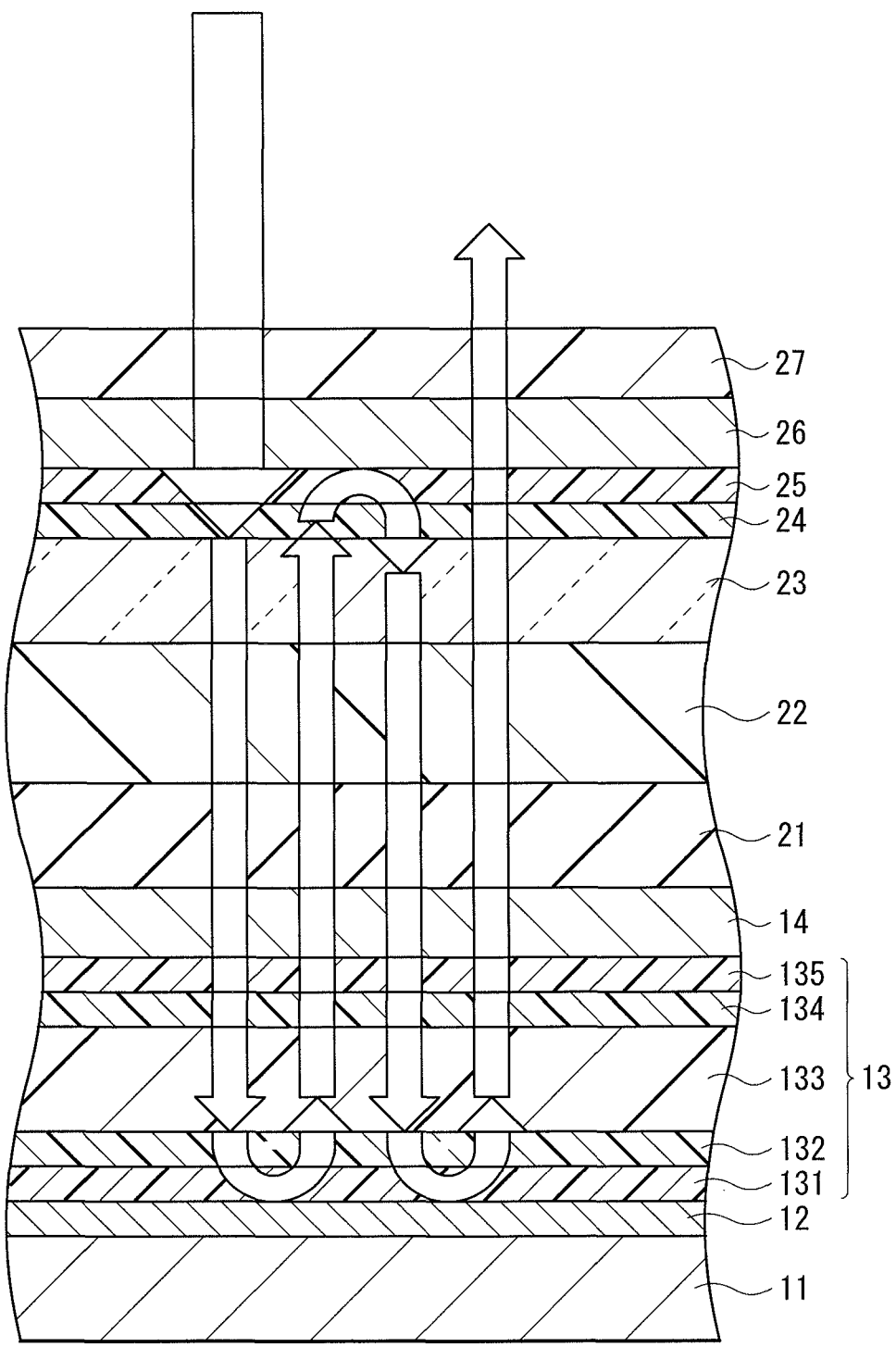
FIG. 8 is a sectional view for explaining an effect of the outside-light reflection suppression layer shown in FIG. 3.
Figure 9:
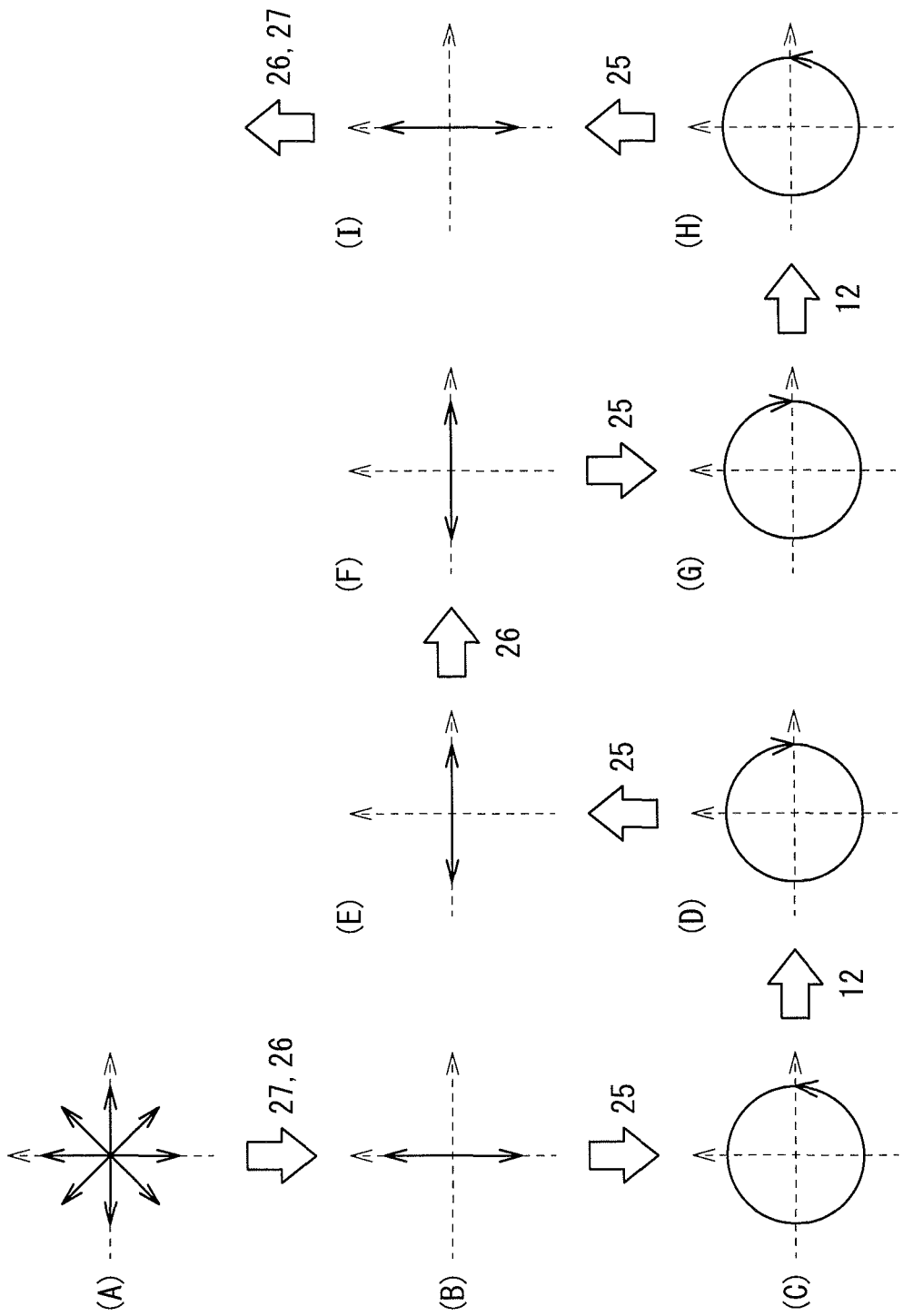
FIG. 9 is a schematic view for explaining a polarization direction of outside light shown in FIG. 8.

FIG. 8 illustrates a reflection path of outside light in the display 1. (A) to (I) of FIG. 9 each schematically illustrate a polarization direction of light along such a reflection path. While outside light entering the display 1 through the display surface is not polarized as shown in (A) of FIG. 9, the outside light changes into linear polarization ((B) of FIG. 9) after passing through the absorption-type polarizing plate 27 and the reflection-type polarizing plate 26, so that intensity of the light is reduced to approximately half. The light changes into circular polarization after passing through the quarter retardation film 25 ((C) of FIG. 9), and then reflected by the lower electrode 12, so that its circular polarization direction is reversed ((D) of FIG. 9). The light then passes through the quarter retardation film 25 and thus changes into linear polarization ((E) of FIG. 9). However, the light axis direction of the linear polarization is orthogonal to that of the linear polarization before the first action of passing through the quarter retardation film 25 ((B) of FIG. 9), and therefore the linear polarization is reflected by the reflection-type polarizing plate 26 ((F) of FIG. 9), and passes through the quarter retardation film 25 ((G) of FIG. 9). After passing through the quarter retardation film 25, the linear polarization changes into circular polarization. The circular polarization is then reflected by the lower electrode 12, so that its circular polarization direction is reversed again ((H) of FIG. 9). The circular polarization then passes through the quarter retardation film 25 and thus changes into linear polarization having a polarization axis parallel to each polarization axis of the absorption-type polarizing plate 27 and the reflection-type polarizing plate 26 ((I) of FIG. 9). The linear polarization thus goes to the display surface.

Consequently, the outside light entering the display 1 advances through the absorption-type polarizing plate 27, the reflection-type polarizing plate 26, the quarter retardation film 25, and the outside-light reflection suppression layer 24 in this order, and then is reflected by the lower electrode 12, and then advances through the outside-light reflection suppression layer 24 and the quarter retardation film 25 in this order, and then is reflected by the reflection-type polarizing plate 26, and then advances through the quarter retardation film 25 and the outside-light reflection suppression layer 24 in this order, and then is reflected by the lower electrode 12, and then advances through the outside-light reflection suppression layer 24, the quarter retardation film 25, the reflection-type polarizing plate 26, and the absorption-type polarizing plate 27 in this order. Specifically, intensity $L_r$ of reflected light of outside light, which exits through the display surface, is expressed by numerical expression (5), where intensity of the outside light on entering the display 1 is $L_0$.

[Numerical Expression 5]

$$L_r = L_0 \times r \times (T_p)^2 \times (T_a)^4 \times R^2 \qquad (5)$$

Figure 10:
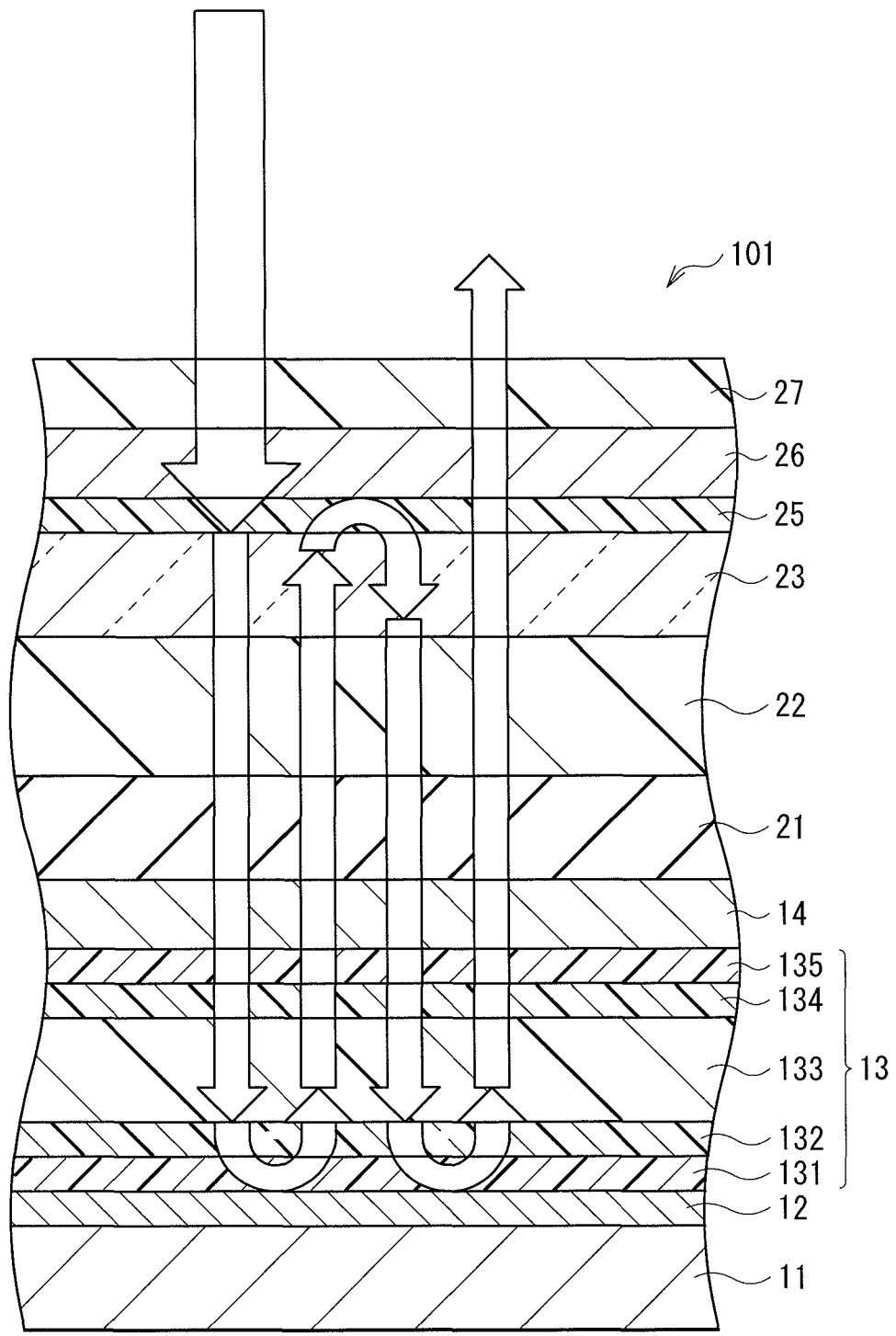
FIG. 10 is a sectional view illustrating a partial configuration of a display according to comparative example 2.

In contrast, FIG. 10 illustrates reflected light of outside light in a display (display 101) according to comparative example 2. In the display 101, the outside-light reflection suppression layer 24 is not provided, and therefore outside light is greatly attenuated only on entering each of the absorption-type polarizing plate 27 and the reflection-type polarizing plate 26 ((B) of FIG. 9).

Specifically, a ratio of the intensity $L_r$ of reflected light of outside light in the display 1 to intensity $L_r'$ of reflected light of outside light in the display 101 is defined as suppression rate β, and the suppression rate β is expressed by numerical expression (6). For example, if the light transmittance Ta of the outside-light reflection suppression layer 24 is 0.841, β is 0.5. That is, the $L_0$ is attenuated to half while outside light passes through the outside-light reflection suppression layer 24 four times. Furthermore, for example, if R is 0.9, r is 0.5, and Tp is 0.86, outside light is attenuated to about 18.4% of outside light on entering ($L_0$) (numerical expression (5)).

[Numerical Expression 6]

$$\beta = \frac{L_r}{L_r'} = \frac{L_0 \times r \times (T_p)^2 \times (T_a)^4 \times R^2}{L_0 \times r \times (T_p)^2 \times R^2} = (T_a)^4 \qquad (6)$$

It is to be noted that intensity of reflection of outside light is affected by open area ratio, light transmittance of the color filter, and light transmittance of the black matrix, in addition to the above-described parameters. The total reflectance of the display, including such factors, is preferably 4% or less to improve visibility. In other words, the light transmittance Ta of the outside-light reflection suppression layer 24 is preferably set such that the total reflectance is 4% or less, in consideration of such factors.

In the present embodiment, the outside-light reflection suppression layer 24 is disposed between the light emitting layer 133 and the reflection-type polarizing plate 26, so that reflection of outside light is efficiently attenuated, while extraction efficiency of light extracted through the display surface is improved. For example, as shown in FIG. 11, an outside-light reflection suppression layer (outside-light reflection suppression layer 124) is likely to be provided on a top surface (on a display surface side of the absorption-type polarizing plate 27). In such a case, however, outside light entering the display passes through the outside-light reflection suppression layer two times, and therefore intensity $L_r''$ of reflected light is expressed by numerical expression (7), showing a reduction in the attenuation effect. Ta' represents the light transmittance of the outside-light reflection suppression layer 124. The light transmittance Ta' of the outside-light reflection suppression layer 124 has to be decreased to 0.707 in order to attenuate intensity of light to approximately half as in the above while the light passes through the outside-light reflection suppression layer two times.

[Numerical Expression 7]

$$L_r'' = L_0 \times r \times (T_p)^2 \times (T_a')^2 \times R^2 \qquad (7)$$

Figure 12A:
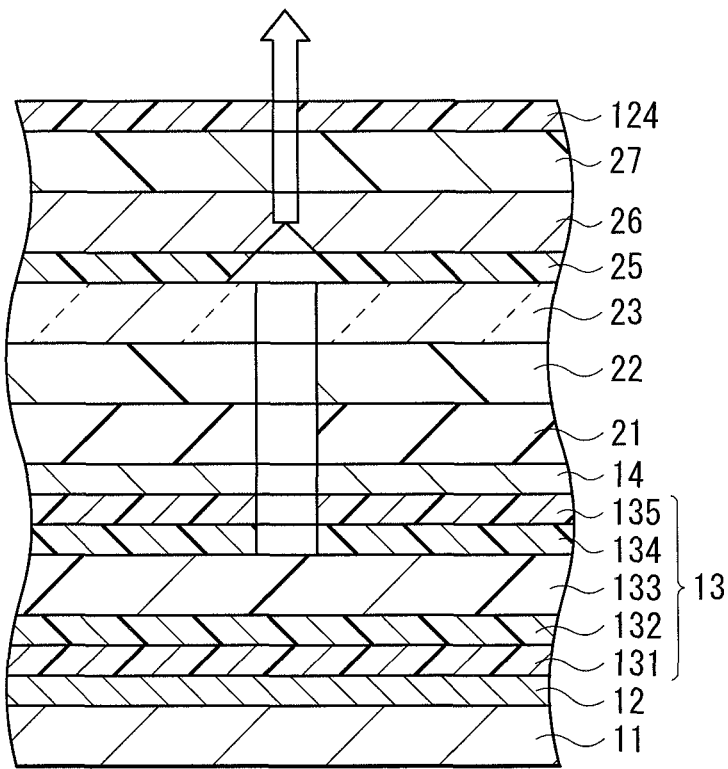
FIGS. 12A and 12B are sectional views for explaining extraction of light emitted from a light emitting layer shown in FIG. 11 through a display surface.
Figure 12B:
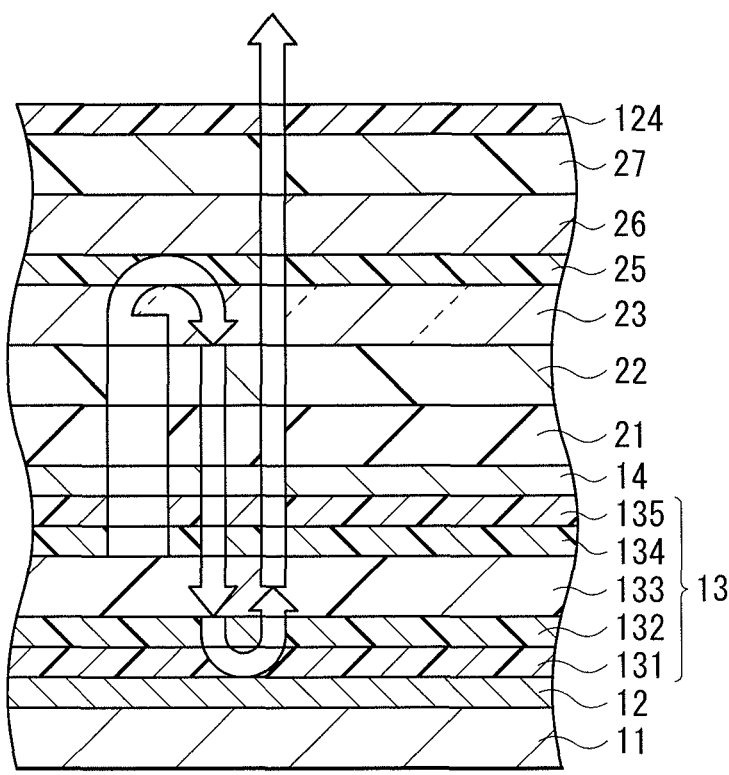

In the case where the outside-light reflection suppression layer 124 is provided on the top surface, as shown in FIGS. 12A and 12B, light emitted from the light emitting layer 133 advances through the quarter retardation film 25, the reflection-type polarizing plate 26, the absorption-type polarizing plate 27, and the outside-light reflection suppression layer 124 in this order; or the light advances through the quarter retardation film 25, and then is reflected by the reflection-type polarizing plate 26, and reflected by the lower electrode 12, and then advances through the quarter retardation film 25, the reflection-type polarizing plate 26, the absorption-type polarizing plate 27, and the outside-light reflection suppression layer 124 in this order. That is, in this situation, intensity I" of light extracted through the display surface from the light emitting layer 133 is expressed by numerical expression (8). If the value of Ta' is reduced such that an outside-light reflection suppression effect is achieved at the same level as in the case where the outside-light reflection suppression layer 24 is disposed between the light emitting layer 133 and the reflection-type polarizing plate 26 (FIG. 3), extraction efficiency of display light is reduced. An experiment was conducted, where Ta' and Ta were adjusted to be 0.707 and 0.841, respectively. The result of the experiment revealed that the intensity I of display light in the present embodiment showed an increase in luminance by about 10% compared with the intensity I".

[Numerical Expression 8]

$$I'' = I_0 \times (1-r) \times T_p \times T_a' + I_0 \times r \times T_p \times T_a' \times R \qquad (8)$$

There has been proposed a method of suppressing reflection of outside light and improving extraction efficiency of light emitted from a light emitting layer, in which a quarter retardation film is configured of a reflective-type cholesteric liquid crystal (for example, Japanese Unexamined Patent Application Publication No. 2001-357979). However, one type of liquid crystal material achieves the effects over a wavelength range of about 100 nm to 150 nm, which is insufficient for covering the entire visible region. For example, color-coding has to be performed depending on emission colors, or a stacked structure is necessary in order to use such method for a wide wavelength range; hence, such method is practically hard to be used.

As described above, in the first embodiment, the outside-light reflection suppression layer 24 is provided between the light emitting layer 133 and the reflection-type polarizing plate 26, specifically, between the counter substrate 23 and the quarter retardation film 25. This allows reduction in the intensity $L_r$ of reflected light of outside light, and thus allows suppression of going of the reflected light to the display surface. In addition, the reflection-type polarizing plate 26 is provided between the quarter retardation film 25 and the absorption-type polarizing plate 27, thus allowing improvement in extraction efficiency of light emitted from the light emitting layer 133. Consequently, a reduction in image quality and in visibility due to reflection of outside light is prevented, and low power consumption and a long life are achieved.

In addition, the outside-light reflection suppression layer 24 is prepared, for example, by mixing dye into a resin material; hence, the outside-light reflection suppression layer 24 is readily formed for practical use.

While Modifications of the first embodiment and a second embodiment are described below, the same constitutional portions as those in the first embodiment are designated by the same numerals in the following description, and description of them is appropriately omitted.

[Modification 1]

Figure 13:
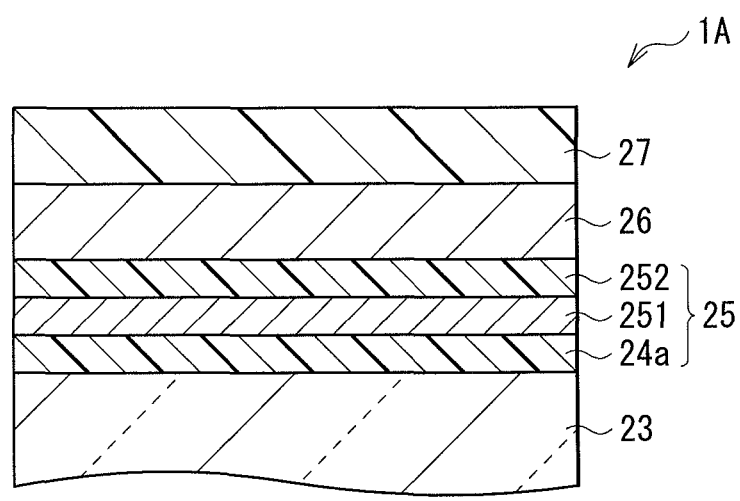
FIG. 13 is a sectional view illustrating a configuration of a quarter retardation film of a display according to Modification 1.

FIG. 13 illustrates a sectional configuration of part of a display (display 1A) according to Modification 1 of the first embodiment. The display 1A is different from the display 1 of the first embodiment in that an outside-light reflection suppression layer (outside-light reflection suppression layer 24a) is included in part of the quarter retardation film 25. Other configurations of the display 1A are similar to those of the display 1, and functions and effects thereof are also similar to those.

As described above, the quarter retardation film 25 includes the TAC layers on both sides of the wave plate 251. Here, the quarter retardation film 25 includes a TAC layer 252 on a surface on a reflection-type polarizing plate 26 side of the wave plate 251, and has the outside-light reflection suppression layer 24a on a surface on a counter substrate 23 side thereof. The outside-light reflection suppression layer 24a is configured by mixing the above-described dye in the TAC. The outside-light reflection suppression layer 24a can be provided on the surface on the reflection-type polarizing plate 26 side of the wave plate 251, or can be provided on both the surfaces. In this way, part of the quarter retardation film 25 is configured of the outside-light reflection suppression layer 24a, enabling a reduction in thickness of the display 1A.

[Modification 2]

FIG. 14 illustrates a sectional configuration of a display (display 1B) according to Modification 2. The display 1B is different from the display 1 of the first embodiment in that an outside-light reflection suppression layer (outside-light reflection suppression layer 24b) is included in part of a color filter layer (color filter layer 23C). Other configurations of the display 1B are similar to those of the display 1, and functions and effects thereof are also similar to those.

As described before, the color filter layer 23C is configured of the color filters 231R, 231G, and 231B, the black matrix 232, and the overcoat layer. The outside-light reflection suppression layer 24b is formed by mixing dye in the overcoat layer. In this way, part of the color filter layer 23C is configured of the outside-light reflection suppression layer 24b, enabling a reduction in thickness of the display 1B.

[Second Embodiment]

A display (display 2) according to a second embodiment of the disclosure is different from the display of the first embodiment in that the outside-light reflection suppression layer 24 is provided between the quarter retardation film 25 and the reflection-type polarizing plate 26. Other configurations of the display 2 are similar to those of the display 1, and functions and effects thereof are also similar to those.

Figure 15:
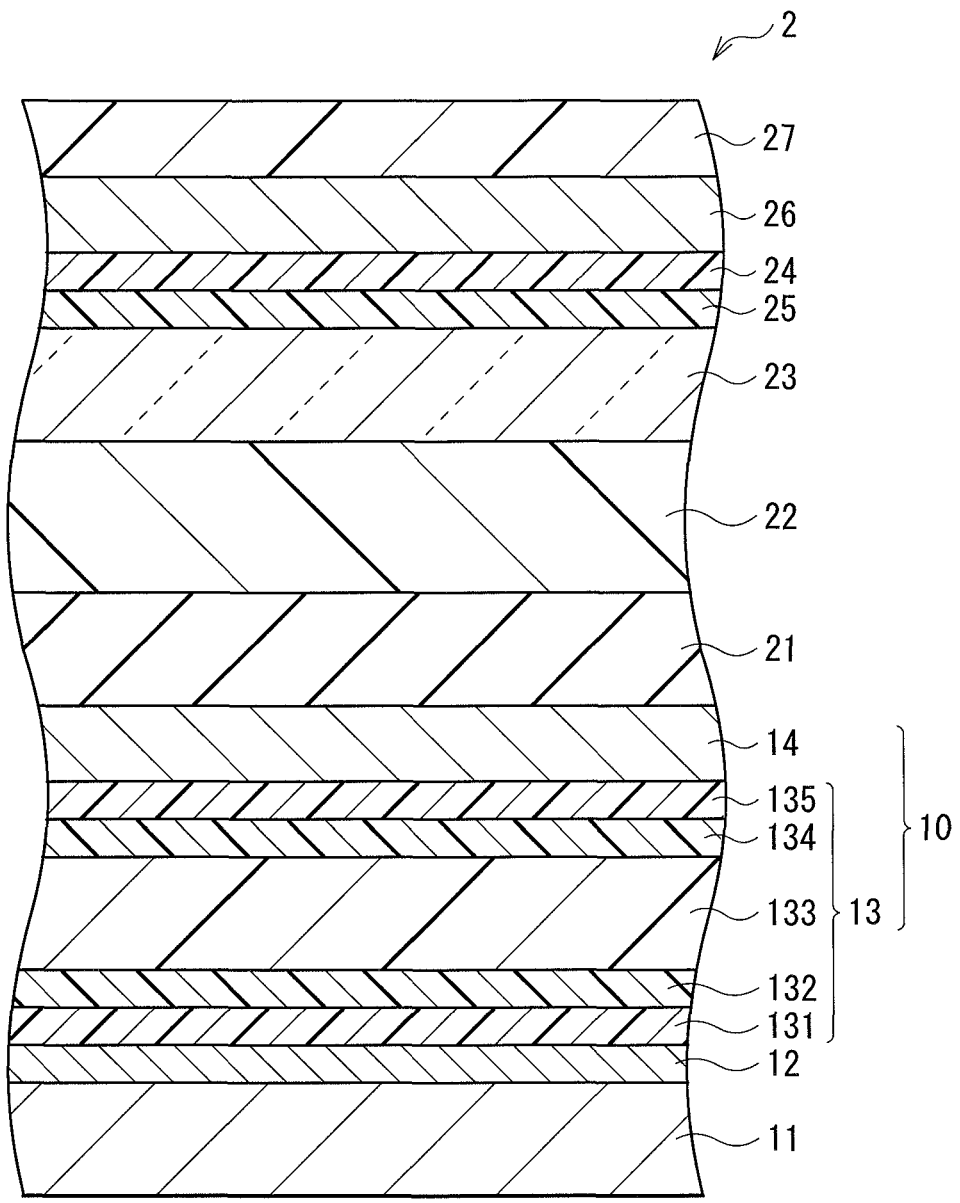
FIG. 15 is a sectional view illustrating a configuration of a display according to a second embodiment of the disclosure.

FIG. 15 illustrates a sectional configuration of the display 2, in which the organic EL device 10 is sealed by the protective layer 21, the sealing section 22, and the counter substrate 23, as in the display 1. The display 2 is different from the display 1 in a configuration on a display surface side of the counter substrate 23, where the quarter retardation film 25, the outside-light reflection suppression layer 24, the reflection-type polarizing plate 26, and the absorption-type polarizing plate 27 are provided in this order.

(Module and Application Examples)

Application examples of each display described in the embodiments and Modifications are now described. Each display according to the embodiments and Modifications is applicable to displays of electronic systems in various fields, which display externally-input or internally-generated image signals as still or video images, including a television apparatus, a digital camera, a notebook personal computer, a mobile terminal device such as a mobile phone, and a video camcorder.

(Module)

Figure 16:
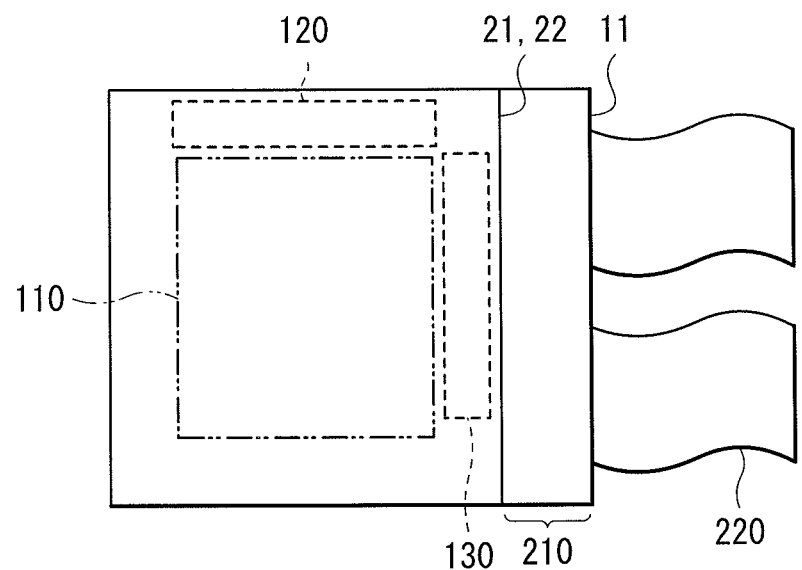
FIG. 16 is a plan view illustrating a schematic configuration of a module including the display according to each of the embodiments.

Each display according to the embodiments and Modifications is built in various electronic systems such as application examples 1 to 5 described below, for example, as a module shown in FIG. 16. In the module, for example, one side of the substrate 11 has a region 210 exposed from the protective layer 21 and the sealing section 22, and an external connection terminal (not shown) is provided on the exposed region 210 by extending wirings for the signal-line drive circuit 120 and the scan-line drive circuit 130. The external connection terminal may be attached with a flexible printed circuit (FPC) 220 for input/output of signals.

APPLICATION EXAMPLE 1

Figure 17:
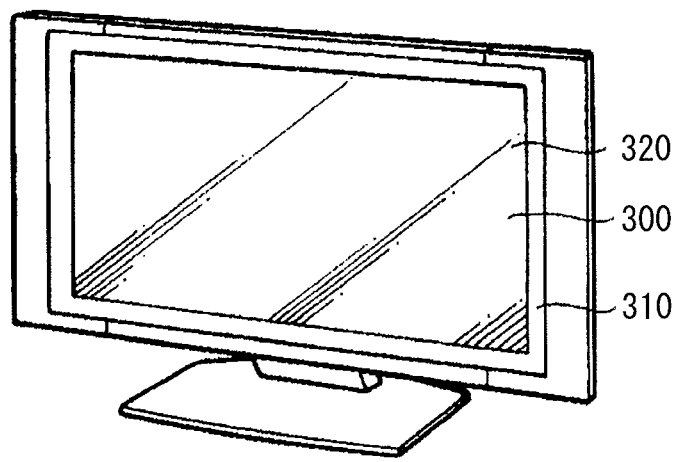
FIG. 17 is a perspective view illustrating appearance of application example 1 of the display according to each of the embodiments.

FIG. 17 shows appearance of a television apparatus to which the display according to the embodiments and Modifications is applied. The television apparatus has, for example, an image display screen section 300 including a front panel 310 and filter glass 320. The image display screen section 300 is configured of the display according to the embodiments and Modifications.

APPLICATION EXAMPLE 2

Figure 18A:
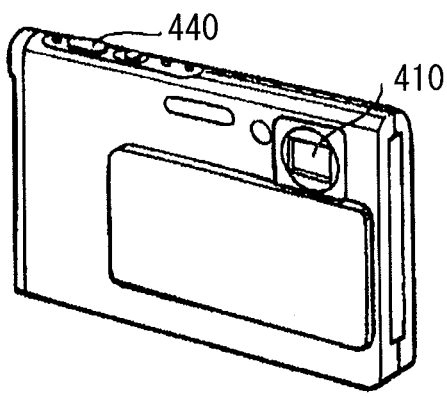
FIG. 18A is a perspective view illustrating appearance of application example 2 as viewed from its front side.
Figure 18B:
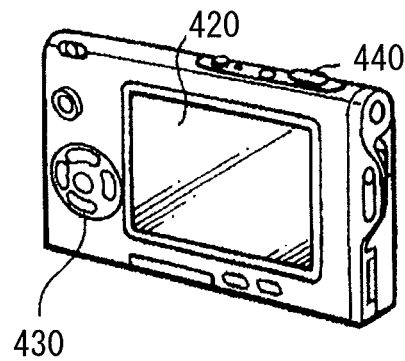
FIG. 18B is a perspective view illustrating appearance thereof as viewed from its back side.

FIGS. 18A and 18B each show appearance of a digital camera to which the display according to the embodiments and Modifications is applied. The digital camera has, for example, a light emitting section 410 for flash, a display section 420, a menu switch 430, and a shutter button 440. The display section 420 is configured of the organic EL display according to each of the embodiments and Modifications.

APPLICATION EXAMPLE 3

Figure 19:
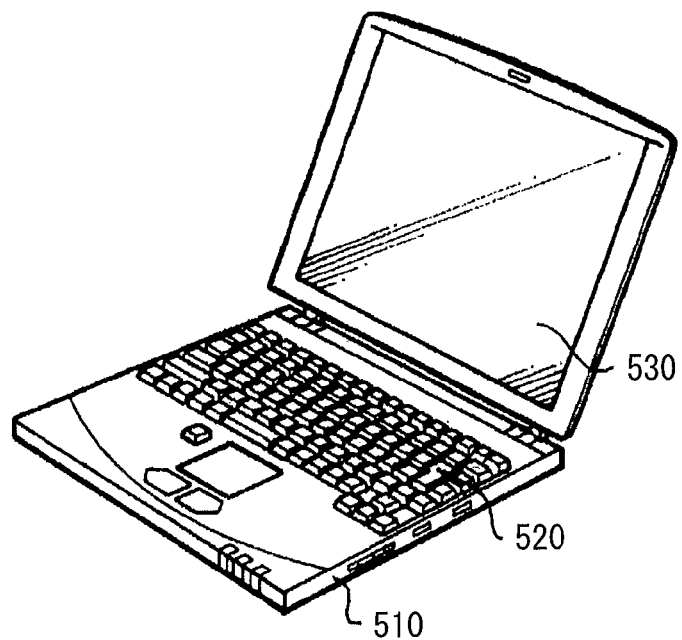
FIG. 19 is a perspective view illustrating appearance of application example 3.

FIG. 19 shows appearance of a notebook personal computer to which the display according to the embodiments and Modifications is applied. The notebook personal computer has, for example, a main body 510, a keyboard 520 for input operation of characters and the like, and a display section 530 that displays images. The display section 530 is configured of the display according to the embodiments and Modifications.

APPLICATION EXAMPLE 4

Figure 20:
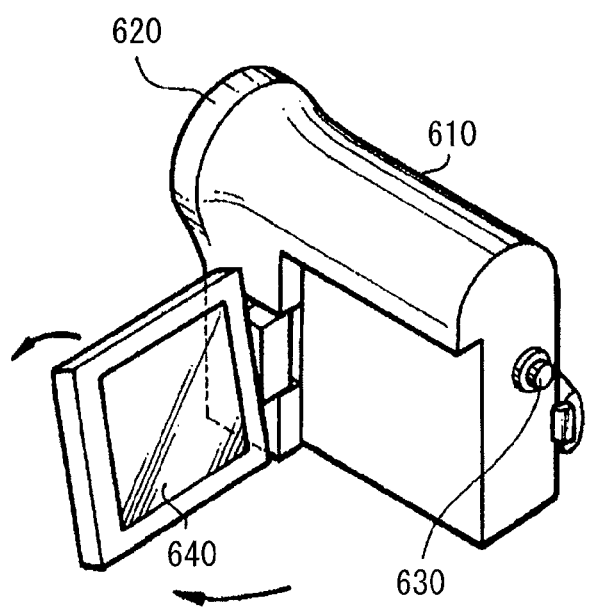
FIG. 20 is a perspective view illustrating appearance of application example 4.

FIG. 20 shows appearance of a video camcorder to which the display according to the embodiments and Modifications is applied. The video camcorder has, for example, a main body section 610, an object-shooting lens 620 provided on a front side face of the main body section 610, a start/stop switch 630 for shooting, and a display section 640. The display section 640 is configured of the display according to the embodiments and Modifications.

APPLICATION EXAMPLE 5

FIGS. 21A to 21G each show appearance of a mobile phone to which the display according to the embodiments and Modifications is applied. For example, the mobile phone is configured of an upper housing 710 and a lower housing 720 connected to each other by a hinge section 730, and has a display 740, a sub display 750, a picture light 760, and a camera 770. The display 740 or the sub display 750 is configured of the display according to the embodiments and Modifications.

While the present application has been described with the embodiments, Modifications, and Application Examples hereinbefore, various modifications or alterations may be made without any limitation. For example, although Modifications 1 and 2 have been described with exemplary cases where part of the quarter retardation film 25 and part of the color filter layer 23C are configured of the outside-light reflection suppression layers 24a and 24b, respectively, the outside-light reflection suppression layer may be formed with the protective layer 21, the sealing section 22, or the counter substrate 23.

In addition, although the embodiments and Modifications have been described with an exemplary case where the outside-light reflection suppression layer 24, 24a, or 24b is a single layer, the outside-light reflection suppression layer may include a plurality of layers.

Furthermore, for example, while the material and the thickness of each layer, and the deposition process and the deposition condition of each layer have been described in the embodiments and Modifications, these are not limitative. In other words, other materials and thicknesses can be used, or other deposition processes and deposition conditions can be used.

In addition, although the embodiments and Modifications have been described with an exemplary case where the retardation film is configured of the quarter retardation film, the retardation film may be configured of another type of retardation film.

Furthermore, although the embodiments and Modifications have been described with a case where the present application is applied to the organic EL display, the application may be applied to other self-luminous displays such as an inorganic EL display and a field emission display (FED).

Accordingly, it is possible to achieve at least the following configurations from the above-described example embodiments and the modifications of the disclosure.

(1) A display, including:
a light emitting layer;
a reflective section reflecting light, that enters through the light emitting layer, to a display surface;
an absorption-type polarizing plate provided on the display surface;
a retardation film provided between the light emitting layer and the absorption-type polarizing plate;
a reflection-type polarizing plate provided between the retardation film and the absorption-type polarizing plate, and reflecting, among light transmitted by the retardation film, light in a predetermined light-axis direction; and
an outside-light reflection suppression layer provided between the light emitting layer and the reflection-type polarizing plate, and absorbing part of outside light.

(2) The display according to (1), wherein the outside-light reflection suppression layer is provided between the light emitting layer and the retardation film.

(3) The display according to (1), wherein the outside-light reflection suppression layer is provided between the retardation film and the reflection-type polarizing plate.

(4) The display according to any one of (1) to (3), wherein a light transmittance of the outside-light reflection suppression layer is within a range of 71% to 95% both inclusive.

(5) The display according to (4), wherein the light transmittance of the outside-light reflection suppression layer is more than 75%.

(6) The display according to any one of (1) to (5), wherein the reflective section serves as an electrode that applies an electric field to the light emitting layer.

(7) The display according to any one of (1) to (6), wherein the outside-light reflection suppression layer includes a resin and a dye.

(8) The display according to (1), wherein the outside-light reflection suppression layer is part of the retardation film.

(9) The display according to (8), wherein the outside-light reflection suppression layer includes triacetylcellulose (TAC) and a dye.

(10) The display according to (1), further including a color filter layer provided between the retardation film and the light emitting layer,
wherein the outside-light reflection suppression layer serves as an overcoat layer provided on a surface that faces the light emitting layer of the color filter layer.

(11) The display according to any one of (1) to (10), wherein the light emitting layer is configured of an organic layer.

(12) The display according to any one of (1) to (11), wherein the retardation film is a quarter retardation film.

(13) An electronic system with a display, the display including:
a light emitting layer;
a reflective section reflecting light, that enters through the light emitting layer, to a display surface;
an absorption-type polarizing plate provided on the display surface;
a retardation film provided between the light emitting layer and the absorption-type polarizing plate;
a reflection-type polarizing plate provided between the retardation film and the absorption-type polarizing plate, and reflecting, among light transmitted by the retardation film, light in a predetermined light-axis direction; and
an outside-light reflection suppression layer provided between the light emitting layer and the reflection-type polarizing plate, and absorbing part of outside light.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display, comprising:
a light emitting layer;
a reflective section reflecting light, that enters through the light emitting layer, to a display surface;
an absorption-type polarizing plate provided on the display surface;
a retardation film provided between the light emitting layer and the absorption-type polarizing plate, wherein the retardation film comprises a triacetylcellulose (TAC) layer and a wave plate;
a reflection-type polarizing plate provided between the retardation film and the absorption-type polarizing plate, and reflecting, among light transmitted by the retardation film, light in a predetermined light-axis direction; and
an outside-light reflection suppression layer provided within the retardation film and between the light emitting layer and the reflection-type polarizing plate, and absorbing part of outside light, wherein the outside-light reflection suppression layer serves as an overcoat layer provided on a surface of the wave plate facing the light emitting layer, and wherein the outside-light reflection suppression layer includes TAC and a dye.

2. The display according to claim 1, wherein the wave plate is provided between the light emitting layer and the triacetylcellulose (TAC) layer.

3. The display according to claim 1, further comprising a counter substrate, wherein the counter substrate is provided between light emitting layer and the outside-light reflection suppression layer.

4. The display according to claim 1, wherein a light transmittance of the outside-light reflection suppression layer is within a range of 71% to 95% both inclusive.

5. The display according to claim 4, wherein the light transmittance of the outside-light reflection suppression layer is more than 75%.

6. The display according to claim 1, wherein the reflective section serves as an electrode that applies an electric field to the light emitting layer.

7. The display according to claim 1, wherein the outside-light reflection suppression layer includes a resin and a dye.

8. The display according to claim 1, wherein the light emitting layer is configured of an organic layer.

9. The display according to claim 1, wherein the retardation film is a quarter retardation film.

10. An electronic system with a display, the display comprising:
a light emitting layer;
a reflective section reflecting light, that enters through the light emitting layer, to a display surface;
an absorption-type polarizing plate provided on the display surface;
a retardation film provided between the light emitting layer and the absorption-type polarizing plate;
a reflection-type polarizing plate provided between the retardation film and the absorption-type polarizing plate, and reflecting, among light transmitted by the retardation film, light in a predetermined light-axis direction; and
an outside-light reflection suppression layer provided between the light emitting layer and the reflection-type polarizing plate, and absorbing part of outside light, and wherein the outside-light reflection suppression layer includes TAC and a dye.

11. The electronic system with a display according to claim 10, further comprising a color filter layer provided between the retardation film and the light emitting layer, wherein the outside-light reflection suppression layer serves as an overcoat layer provided on a surface that faces the light emitting layer of the color filter layer.

12. The electronic system with a display according to claim 11, wherein the outside-light reflection suppression layer is provided in part of the color filter layer.

13. A display, comprising:
a light emitting layer;
a reflective section reflecting light, that enters through the light emitting layer, to a display surface;
an outside-light reflection suppression layer provided on the display surface, wherein the outside-light reflection suppression layer includes triacetylcellulose (TAC) and a dye;
a retardation film provided between the light emitting layer and the outside-light reflection suppression layer;
a reflection-type polarizing plate provided between the retardation film and the outside-light reflection suppression layer, and reflecting, among light transmitted by the retardation film, light in a predetermined light-axis direction; and
an absorption-type polarizing plate between the outside-light reflection suppression layer and the reflection-type polarizing plate, and absorbing part of outside light.

* * * * *